(12) United States Patent
Chang et al.

(10) Patent No.: US 11,573,495 B2
(45) Date of Patent: Feb. 7, 2023

(54) CONTROL OF DYNAMIC GAS LOCK FLOW INLETS OF AN INTERMEDIATE FOCUS CAP

(71) Applicant: Taiwan Semiconductor Manufacturing Company, Ltd., Hsinchu (TW)

(72) Inventors: Chun-Kai Chang, Tainan (TW); Yu Sheng Chiang, Chiayi (TW); Yu De Liou, Taichung (TW); Chi Yang, Tainan (TW); Ching-Juinn Huang, Changhua (TW); Po-Chung Cheng, Chiayi (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/446,226

(22) Filed: Aug. 27, 2021

(65) Prior Publication Data

US 2022/0283506 A1 Sep. 8, 2022

Related U.S. Application Data

(60) Provisional application No. 63/156,634, filed on Mar. 4, 2021.

(51) Int. Cl.
*G03F 7/20* (2006.01)
*H05G 2/00* (2006.01)

(52) U.S. Cl.
CPC ......... *G03F 7/70033* (2013.01); *H05G 2/006* (2013.01); *H05G 2/008* (2013.01)

(58) Field of Classification Search
CPC ..... G06F 7/70033; H05G 2/006; H05G 2/008
See application file for complete search history.

(56) References Cited

U.S. PATENT DOCUMENTS

| 10,718,718 | B2 | 7/2020 | Chang et al. |
| 10,877,378 | B2 | 12/2020 | Chen et al. |
| 2016/0209753 | A1 | 7/2016 | Zhao et al. |
| 2020/0089124 | A1 | 3/2020 | Labetski et al. |

FOREIGN PATENT DOCUMENTS

| TW | 200915015 A | 4/2009 |
| WO | WO-2009032055 A1 | 3/2009 |

*Primary Examiner* — Nicole M Ippolito
*Assistant Examiner* — Hanway Chang
(74) *Attorney, Agent, or Firm* — Harrity & Harrity, LLP

(57) ABSTRACT

A control system includes a plurality of pressure sensors, each to detect a pressure in a respective dynamic gas lock (DGL) nozzle control region of a plurality of DGL nozzle control regions. Each DGL nozzle control region includes one or more DGL nozzles. The control system includes a plurality of mass flow controllers (MFCs). Each MFC of the plurality of MFCs is to control a flow velocity in a respective DGL nozzle control region of the plurality of DGL nozzle control regions. The control system includes a controller to selectively cause one or more MFCs of the plurality of MFCs to adjust flow velocities in one or more DGL nozzle control regions of the plurality of DGL nozzle control regions based on pressures detected by the plurality of pressure sensors in DGL nozzle control regions of the plurality of DGL nozzle control regions.

20 Claims, 17 Drawing Sheets

CONTROL OF DYNAMIC GAS LOCK FLOW INLETS OF AN INTERMEDIATE FOCUS CAP

CROSS-REFERENCE TO RELATED APPLICATION

This Patent Application claims priority to U.S. Provisional Patent Application No. 63/156,634, filed on Mar. 4, 2021, and entitled "INDIVIDUAL CONTROL OF DYNAMIC GAS LOCK FLOW INLETS OF AN INTERMEDIATE FOCUS CAP." The disclosure of the prior Application is considered part of and is incorporated by reference into this Patent Application.

BACKGROUND

An extreme ultraviolet (EUV) source can generate EUV light using a laser to excite particles, such as tin (Sn) particles. In operation, the laser excites the particles to generate a tin-based plasma that emits light in the desired EUV radiation wavelength range. A dynamic gas lock (DGL) of an intermediate focus (IF) cap is a particle collector that is used to prevent particles from escaping a vessel of the EUV source and entering an EUV scanner (which could otherwise result in damage to a reticle/photomask in the EUV scanner).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
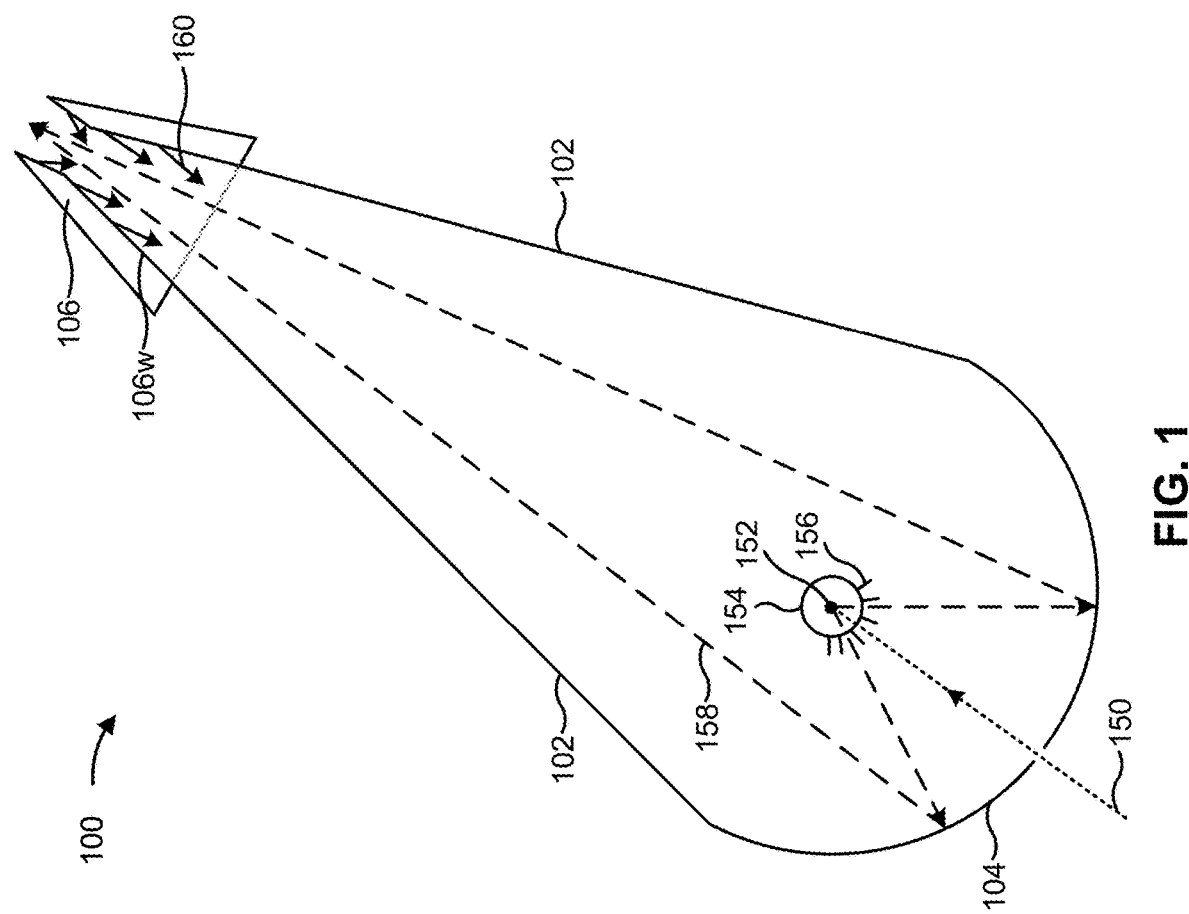
FIG. 1 is a diagram illustrating an embodiment of a radiation source.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In operation of a radiation source, such as an EUV source, flow separation can cause turbulence and a vortex to form on a cone wall of a DGL of an IF cap. If there is asymmetric particle (e.g., Sn particle) deposition on the cone wall, then this asymmetric particle deposition triggers earlier flow separation and generates a comparatively more intense vortex. This comparatively more intense vortex increases a rate of accumulation of particles on the cone wall, which causes a cone flow direction to become asymmetric. The asymmetry in the cone flow direction then causes further asymmetric particle deposition on the cone wall. Particle deposition on the cone wall can result in nozzles of the DGL being at least partially blocked. A partial blockage of a DGL nozzle causes flow velocity from the DGL nozzle to increase, which worsens the asymmetry of the flow and increases a rate of the particle accumulation at the location of the block. As the particle accumulation becomes thicker, accumulated particles are heated by the light and released from the cone wall. Released tin particles can move from a vessel of the radiation source to a scanner. The gas in the scanner carries the tin particles (which can bounce off of the mirrors in the scanner) toward a reticle, and the tin particles may stick to the reticle. Tin particles on the reticle can result in the formation reticle defects, thereby reducing pattern quality and wafer yield, or even damage to the scanner.

Currently, the DGL of the IF cap has three rows of DGL nozzles, with the first row and the second row being exposed at a vessel environment. Here, all of the DGL nozzles of the first and second rows are supplied via the same fluid channel, meaning that all of the DGL nozzles of the first and second rows are controlled together, and that flow velocity for a subset of DGL nozzles in a given row cannot be adjusted independently. Additionally, there is no mechanism to detect flow velocity at the DGL nozzles in order to enable detection of a blockage of a given DGL nozzle.

Some aspects described herein provide techniques and apparatuses for a control system and a DGL (of an IF cap) capable of reducing or preventing asymmetric particle (e.g., Sn particle) deposition on a cone wall of the DGL. In some implementations, the reduction or prevention of asymmetric deposition is enabled by improved control of flow velocity at DGL nozzles of the DGL. For example, in some implementations, the DGL nozzles are separated into multiple DGL nozzle control regions (e.g., four DGL nozzle control regions), and a flow velocity in each DGL nozzle control region is controlled by an independent mass flow controller (MFC) (e.g., flow velocity in each DGL nozzle control region may be controlled by a different MFC). In some implementations, the control system is capable of determining flow velocities at the DGL nozzles to determine whether a given DGL nozzle in a given DGL nozzle control region is at least partially blocked by particle deposition. In some implementations, the control system comprises one or more pressure sensors (e.g., installed in or near one or more DGL nozzles in each DGL nozzle control region) that are used in association with determining the flow velocities (e.g., based on pressures detected by the pressure sensors). Additional details regarding the control system are provided below.

In some implementations, the techniques and apparatuses described herein reduce or prevent particle deposition on the cone wall, which reduces a likelihood of particles moving from a radiation source to a scanner toward a reticle, thereby reducing a likelihood of forming defects, meaning that pattern quality and wafer yield are improved and damage to a scanner is prevented.

FIG. 1 is a diagram illustrating an embodiment of a radiation source 100. The radiation source 100 may be, for example, an EUV source. As shown in FIG. 1, the radiation source 100 includes a vessel 102, a collector 104, and an IF cap 106 with a cone wall 106w. Notably, radiation source 100 includes other components and features that, for the purposes of clarity, are not shown in FIG. 1. The other components and features of the radiation source 100 may include, for example, a laser source, a beam delivery system, a focus lens, a droplet generator, a droplet collector, one or more exhaust ports, one or more vanes, one or more gutters, or one or more drains, among other examples.

The radiation source 100 utilizes a laser produced plasma (LPP) to generate light (e.g., EUV light). In operation, a laser source, such as a pulse carbon dioxide ($CO_2$) laser generates a laser beam 150. As shown, the laser beam 150 is provided (e.g., by a beam delivery system to a focus lens) such that the laser beam 150 is focused through a window of the collector 104. The laser beam 150 is focused to target material 152 (e.g., Sn droplets provided by a droplet generator), which generates plasma 154. The plasma 154 produces plasma emission 156, some of which is radiation 158. As shown, the collector 104 reflects and focuses the radiation 158 through the vessel 102 toward an opening of the IF cap 106 (e.g., for use in a lithography exposing process).

The IF cap 106 is a component that provides intermediate focus to the radiation 158. In some implementations, a DGL is integrated in the IF cap 106. The DGL of the IF cap 106 serves to prevent a substance in the vessel 102 from leaving the vessel 102. For example, as indicated in FIG. 1, the DGL injects, via a group of DGL nozzles, a fluid 160 (e.g., hydrogen gas ($H_2$)) in a direction away from an opening of the IF cap 106 in order to prevent a fluid, particles, droplets, or another type of material present in the environment of the vessel 102 from leaving the vessel 102 (e.g., to prevent the particles or droplets from moving to a scanner). In some implementations, a control system is utilized to control flow velocities at the DGL nozzles. Additional details regarding the IF cap 106 with the integrated DGL and the control system associated with controlling flow velocities at the DGL nozzles are described below.

As indicated above, FIG. 1 is provided as an example. Other examples may differ from what is described with regard to FIG. 1. The number and arrangement of components shown in FIG. 1 are provided as an example. In practice, there may be additional components, fewer components, different components, or differently arranged components than those shown in FIG. 1.

FIGS. 2A-2D are diagrams associated with an embodiment of a DGL of an IF cap 106 and a control system 200 associated with controlling flow velocities at DGL nozzles as described herein.

Figure 2A:
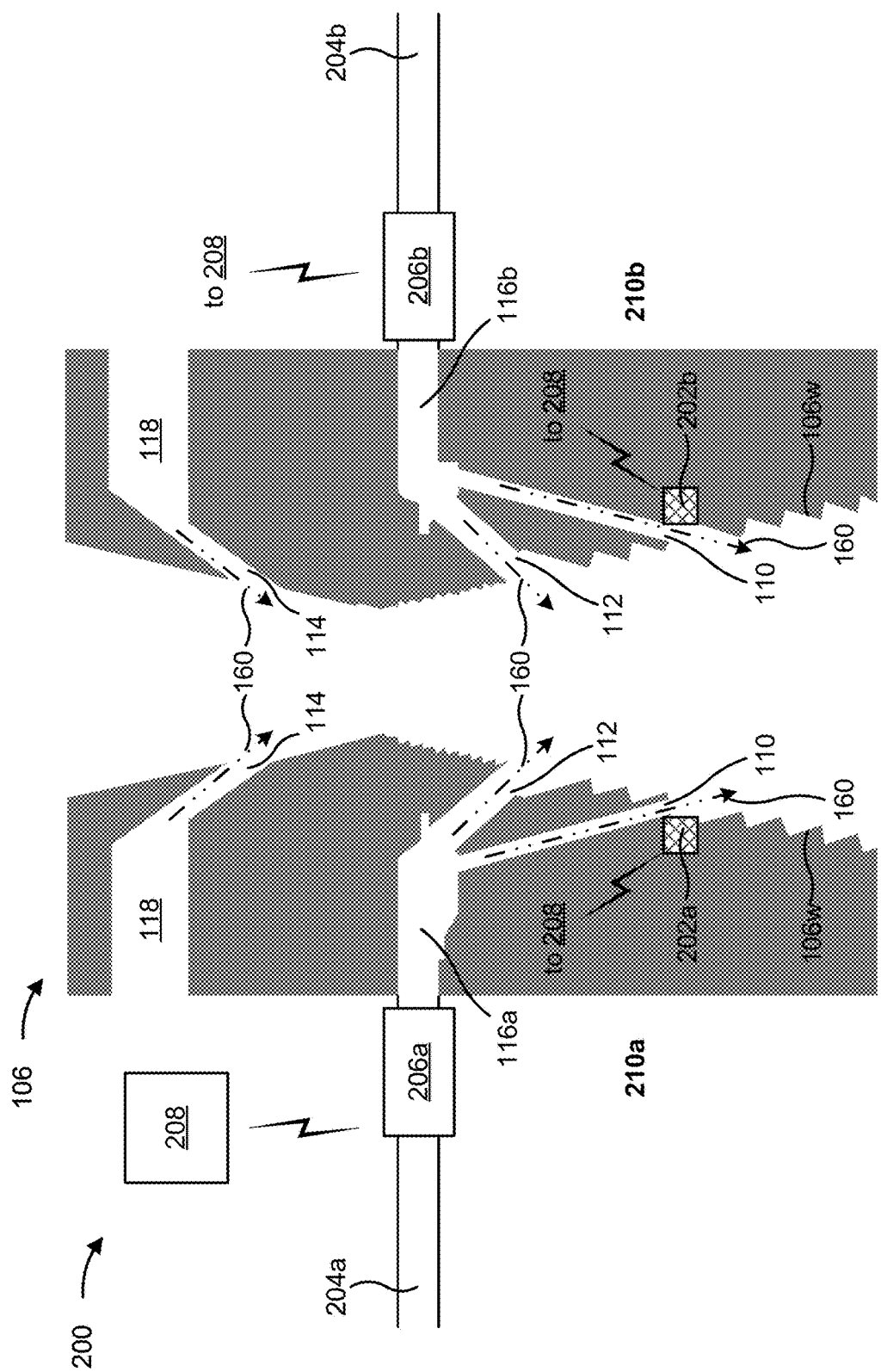
FIGS. 2A-2D are diagrams associated with an embodiment of a DGL of an IF cap and a control system associated with controlling flow velocities at DGL nozzles as described herein.
Figure 2B:
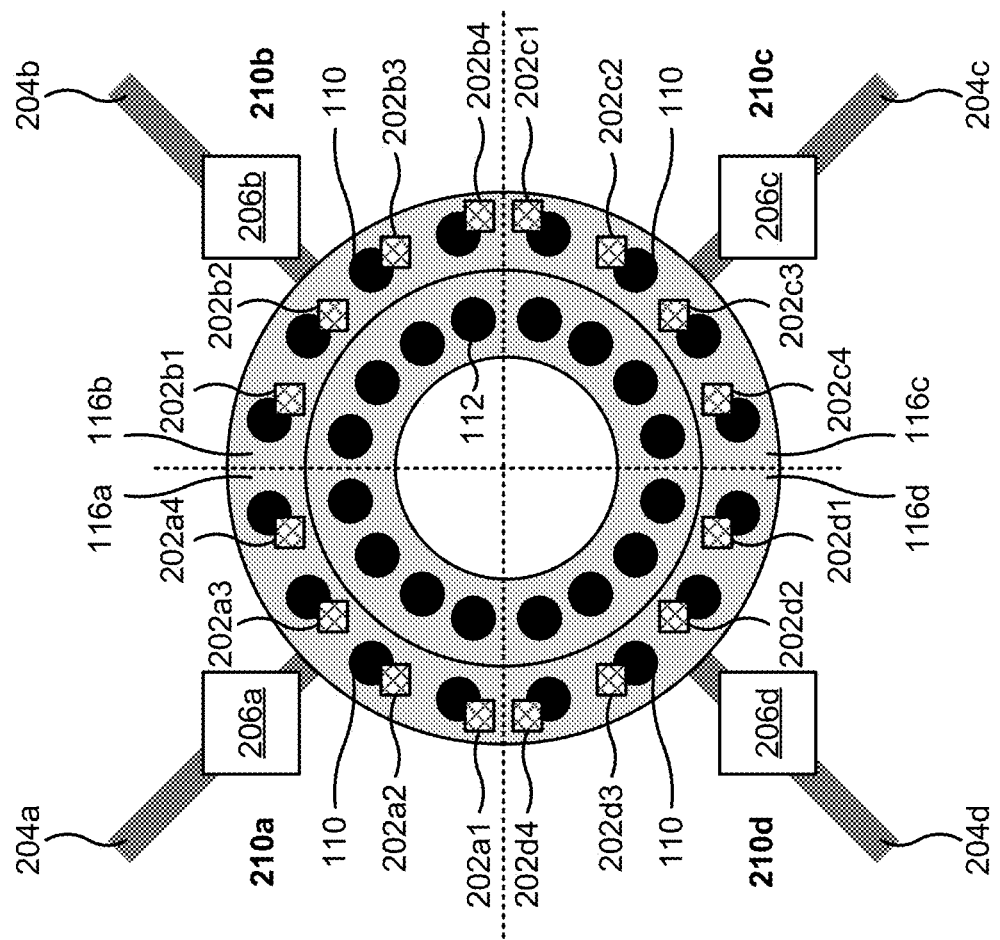

As shown in FIGS. 2A and 2B, the IF cap 106 includes DGL nozzles 110 (e.g., a first row of DGL nozzles), DGL nozzles 112 (e.g., a second row of DGL nozzles), and DGL nozzles 114 (e.g., a third row of DGL nozzles, not shown in FIG. 2B). In some implementations, as shown, each group of DGL nozzles are arranged around a circumference of an opening of the IF cap 106 at different locations on a cone wall 106w of the IF cap 106. In some implementations, each row of DGL nozzles 110 has a quantity of DGL nozzles that enables division into multiple control regions. For example, the IF cap 106 may include 16 DGL nozzles in a given row so that each row can be divided into four regions. In some implementations, a size of an exit of a given DGL nozzle 110 (e.g., a DGL nozzle 110, a DGL nozzle 112, a DGL nozzle 114) may be approximately 1 millimeter (e.g., 1.1 mm). In some implementations, the IF cap 106 may include a different number of DGL nozzle holes (e.g., fewer than 16, more than 16) and/or DGL nozzle holes with sizes other than approximately 1 mm (e.g., smaller than 1.1 mm, larger than 1.1 mm), depending on design and/or size constraints of the IF cap 106.

Figure 2C:
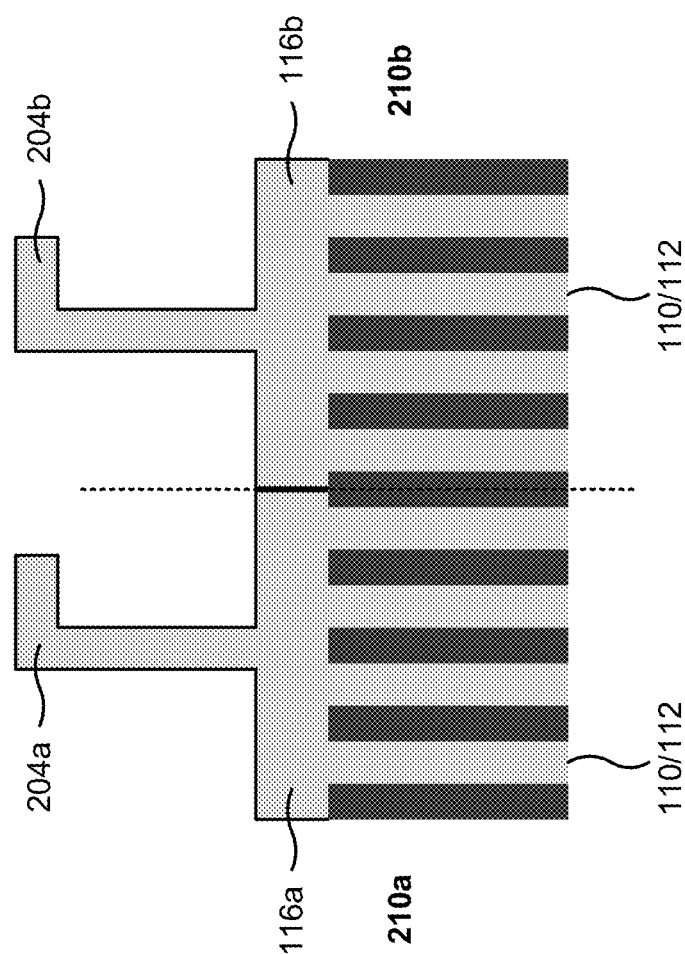

In some implementations, subsets of the DGL nozzles 110 and subsets of the DGL nozzles 112 are supplied fluid via different fluid channels 116. For example, as shown in FIGS. 2A and 2B, a first subset of the DGL nozzles 110 and a first subset of the DGL nozzles 112 may be supplied with the fluid 160 via a fluid channel 116a, a second subset of the DGL nozzles 110 and a second subset of the DGL nozzles 112 may be supplied with the fluid 160 via a second fluid channel 116b, a third subset of the DGL nozzles 110 and a third subset of the DGL nozzles 112 may be supplied with the fluid 160 via a third fluid channel 116c, and a fourth subset of the DGL nozzles 110 and a fourth subset of the DGL nozzles 112 may be supplied with the fluid 160 via a fourth fluid channel 116d. Here, each fluid channel 116 is separate from each other fluid channel 116. FIG. 2C is a conceptual illustration of the separation of the fluid channels 116 in association with supplying the fluid 160 to the different subsets of the DGL nozzles 110 and DGL nozzles 112. Notably, the DGL nozzles 114 are supplied with the fluid 160 via a fluid channel 118 (e.g., each DGL nozzle 114 may be supplied via a single fluid channel 118 that is separate from the fluid channels 116), as shown in FIG. 2A.

In some implementations, as shown in FIG. 2B, a particular subset of the DGL nozzles 110 and a particular subset of the DGL nozzles 112 are included in a particular DGL nozzle control region 210 utilized by the control system 200. For example, in the implementation shown in FIG. 2B, a first subset of four DGL nozzles 110 and a first subset of four DGL nozzles 112 are included in a DGL nozzle control region 210a, a second subset of four DGL nozzles 110 and a second subset of four DGL nozzles 112 are included in a DGL nozzle control region 210b, a third subset of four DGL nozzles 110 and a third subset of four DGL nozzles 112 are included in a DGL nozzle control region 210c, and a fourth subset of four DGL nozzles 110 and a fourth subset of four DGL nozzles 112 are included in a DGL nozzle control region 210d.

In some implementations, each DGL nozzle control region 210 includes a same quantity of DGL nozzles. For example, as shown in FIG. 2B, each of DGL nozzle control region 210a, DGL nozzle control region 210b, DGL nozzle control region 210c, and DGL nozzle control region 210d includes four DGL nozzles 110 and four DGL nozzles 112. In some implementations, having an equal number of DGL nozzles across the DGL nozzle control regions 210 enables control of the flow field by improving flow uniformity. In some implementations, as described below, a controller 208 of the control system 200 may control flow velocities among the DGL nozzle control regions 210 independently of one another (e.g., in order to reduce or prevent blockage of one or more DGL nozzles).

In some implementations, the control system 200 includes at least two DGL nozzle control regions 210. For example, as shown in FIG. 2B, the control system 200 may, in some implementations, include four DGL nozzle control regions 210. In general, the control system 200 may include any number of control regions greater than one. Notably, a higher number of DGL nozzle control regions 210 enables improved control of the fluid field by providing comparatively more granular control of the injection of the fluid 160. Conversely, a lower number of DGL nozzle control regions 210 reduces complexity and cost of the control system 200 by reducing a number of components in the control system 200, thereby simplifying manufacturability and configuration of the control system 200. Alternative examples of configurations of the DGL nozzle control regions 210 are described below.

As further shown in FIGS. 2A and 2B, the control system 200 includes a group of pressure sensors 202 (e.g., pressure sensor 202a, pressure sensor 202b), a group of manifolds 204, a group of mass flow controllers (MFCs) 206, and a controller 208.

A pressure sensor 202 is a component capable of detecting an amount of pressure at the pressure sensor 202 and providing a signal indicating the pressure at the pressure sensor 202. That is, the pressure sensor 202 is a device that generates and provides a signal having a level that is a function of the pressure at the pressure sensor 202. In some implementations, the pressure sensor 202 is capable of communicating with the controller 208 (e.g., via a wired connection or a wireless connection).

In some implementations, as illustrated in FIGS. 2A and 2B, a pressure sensor 202 is arranged at or near a DGL nozzle 110. That is, in some implementations, pressure sensors 202 are arranged at DGL nozzles in a first row of DGL nozzles of the IF cap 106. The pressure sensors 202 are configured to monitor the inlet flow from the DGL nozzles 110. In some implementations, arrangement of the pressure sensors 202 at the DGL nozzles 110 (rather than at DGL nozzles 112 or DGL nozzles 114) improves detection of DGL nozzle blockage because a blockage is more likely to occur at a DGL nozzle 110 than at a DGL nozzle 112 or a DGL nozzle 114.

In some implementations, as shown in FIG. 2B, a pressure sensor 202 is installed at each DGL nozzle 110 of the IF cap 106. For example, as shown, pressure sensors 202a1, 202a2, 202a3, and 202a4 may be installed at DGL nozzles 110 in the DGL nozzle control region 210a, pressure sensors 202b1, 202b2, 202b3, and 202b4 may be installed at DGL nozzles 110 in the DGL nozzle control region 210b, pressure sensors 202c1, 202c2, 202c3, and 202c4 may be installed at DGL nozzles 110 in the DGL nozzle control region 210c, and pressure sensors 202d1, 202d2, 202d3, and 202d4 may be installed at DGL nozzles 110 in the DGL nozzle control region 210d. Alternative examples of arrangements of pressure sensors 202 are described below.

A manifold 204 includes one or more plumbing fixtures (e.g., tubes, pipes, valves, and/or the like) through which the fluid 160 is provided to a fluid channel 116 for injection by one or more DGL nozzles 110 and one or more DGL nozzles 112. Notably, in some implementations, a given manifold 204 supplies the fluid 160 to a fluid channel 116 only, and a separate plumbing fixture (e.g., another manifold, not shown in FIGS. 2A and 2B) supplies the fluid 160 to the fluid channel 118.

In some implementations, the control system 200 includes a group of manifolds 204, each of which is associated with a different DGL nozzle control region 210. For example, as shown in FIG. 2B, the control system 200 may include four manifolds 204—a manifold 204a associated with the DGL nozzle control region 210a, a manifold 204b associated with the DGL nozzle control region 210b, a manifold 204c associated with the DGL nozzle control region 210c, and a manifold 204d associated with the DGL nozzle control region 210d.

Figure 2D:
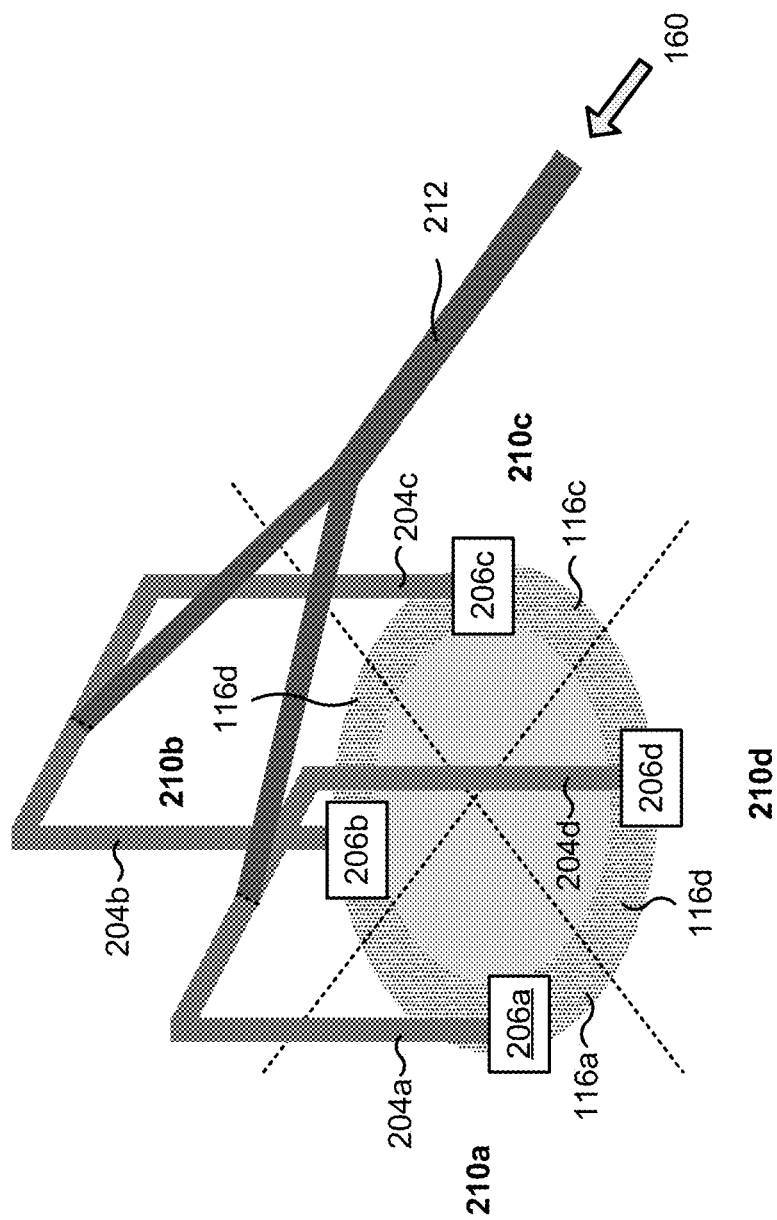

In some implementations, manifolds 204 of the control system 200 are isometric manifolds, meaning that distances of paths of the fluid 160 through the manifolds 204 (e.g., to outlets of the manifolds 204) are substantially the same across the group of manifolds 204. In some implementations, the use of isometric manifolds 204 enables improved uniformity of the flow field. For example, it is desirable to prevent or minimize a difference in pressure and a flow velocity between DGL nozzles of the IF cap 106. According to fluid mechanics theory, a friction force between a fluid and a pipe wall increases a total pressure drop as a length of the pipe increases. Thus, the longer the path, the greater the pressure loss. Also with respect to Bernoulli's equation, a pressure change in a flow field can cause flow velocity change. Here, the isometric manifolds 204 reduce or eliminate a difference in pressure loss among the manifolds 204, thereby improving the distribution of the flow field in the vessel 102. FIG. 2D is a diagram illustrating an example of isometric manifolds 204. As shown in FIG. 2D, the fluid 160 is provided to the manifolds 204a through 204d via a plumbing fixture 212 (e.g., a pipe, tube, or the like). As shown, the lengths of the manifolds 204a through 204d may be substantially the same, meaning that distances of paths of the fluid 160 through the manifolds 204 (e.g., to outlets of the manifolds 204 at the MFCs 206) are substantially the same across the group of manifolds 204.

Returning to FIGS. 2A and 2B, an MFC 206 is a component capable to controlling flow velocity of the fluid 160 in the manifold 204. In some implementations, the MFC 206 includes an inlet port, an outlet port, a sensor (e.g., a mass flow sensor), and a valve (e.g., a proportional control valve). In some implementations, the MFC 206 receives an input signal from the controller 208, where the input signal indicates a mass flow value. The MFC 206 compares the indicated mass flow value to a value from the sensor of the MFC 206 and adjusts the valve of the MFC 206 to achieve the indicated flow rate. While the radiation source 100 may include other MFCs, the MFCs 206 can provide finer and more detail flow control to avoid the flow imbalance when clogging and hole-blocking of a DGL nozzle 112 occurs due to the capability to adjust or fine-tune the valves of the MFCs 206 based on feedback and/or input from the controller 208. In some implementations, the flow rate signaled by the controller 208 corresponds to a flow velocity to be provided by the MFC 206. In some implementations, an MFC 206 is installed on each of the manifolds 204, as shown in FIG. 2B. In some implementations, the MFC 206 is capable of communicating with the controller 208 (e.g., via a wired connection or a wireless connection).

In some implementations, the control system 200 includes a plurality of MFCs 206. While other radiation sources may include a single MFC to provide a flow via a 1-to-2 manifold to DGL nozzles (which results in all the DGL nozzles sharing the 2 sub-flows without fine control), the radiation source described herein includes a plurality of MFCs 206, each of which is associated with a different DGL nozzle control region 210. For example, as shown in FIG. 2B, the control system 200 may include four MFCs 206—an MFC 206a associated with the DGL nozzle control region 210a, an MFC 206b associated with the DGL nozzle control region 210b, an MFC 206c associated with the DGL nozzle control region 210c, and an MFC 206d associated with the DGL nozzle control region 210d.

The controller 208 is a component (e.g., one or more processors) capable of controlling flow velocities in the DGL nozzle control regions 210 of the control system 200. For example, in some implementations, the controller 208 is capable of causing one or more MFCs 206 to adjust flow velocities in one or more DGL nozzle control regions 210 based on pressures detected by pressure sensors 202. In some implementations, the controller 208 is capable of communicating with the pressure sensors 202 (e.g., to receive signals indicating pressures detected by the pressure sensors 202) and with the MFCs 206 (e.g., to transmit signals associated with adjusting flow velocities). Details regarding operation of the controller 208 in association with controlling the flow velocities in the DGL nozzle control regions 210 are described below with respect to FIGS. 3A-3C.

As indicated above, FIGS. 2A-2D are provided as examples. Other examples may differ from what is described with regard to FIGS. 2A-2D. The number and arrangement of components shown in FIGS. 2A-2D are provided as an example. In practice, there may be additional components, fewer components, different components, or differently arranged components than those shown in FIGS. 2A-2D.

Figure 3A:
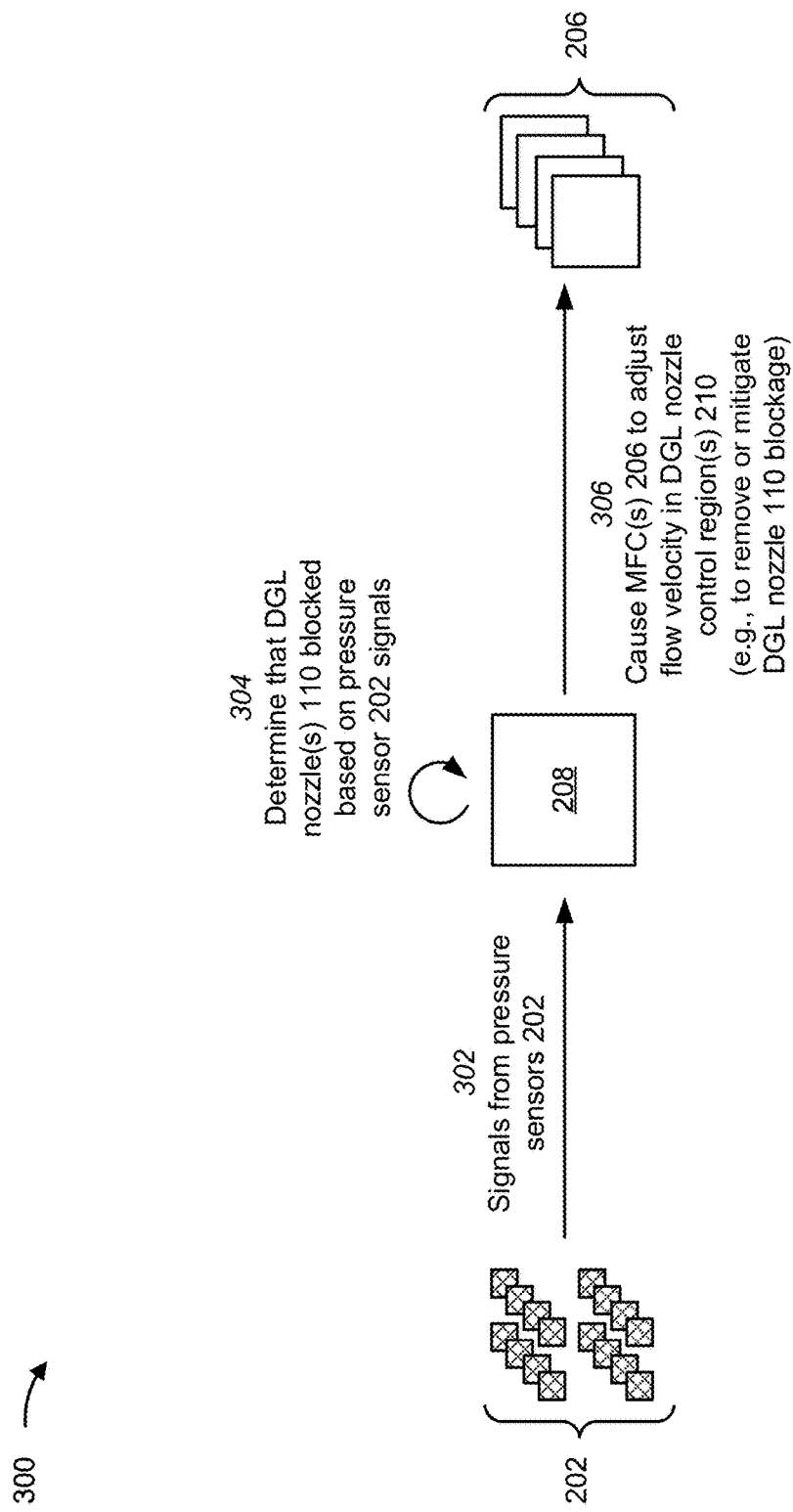
FIGS. 3A-3C are diagrams illustrating embodiments of operations performed by the control system in association with reducing or preventing particle accumulation, as described herein.
Figure 3B:
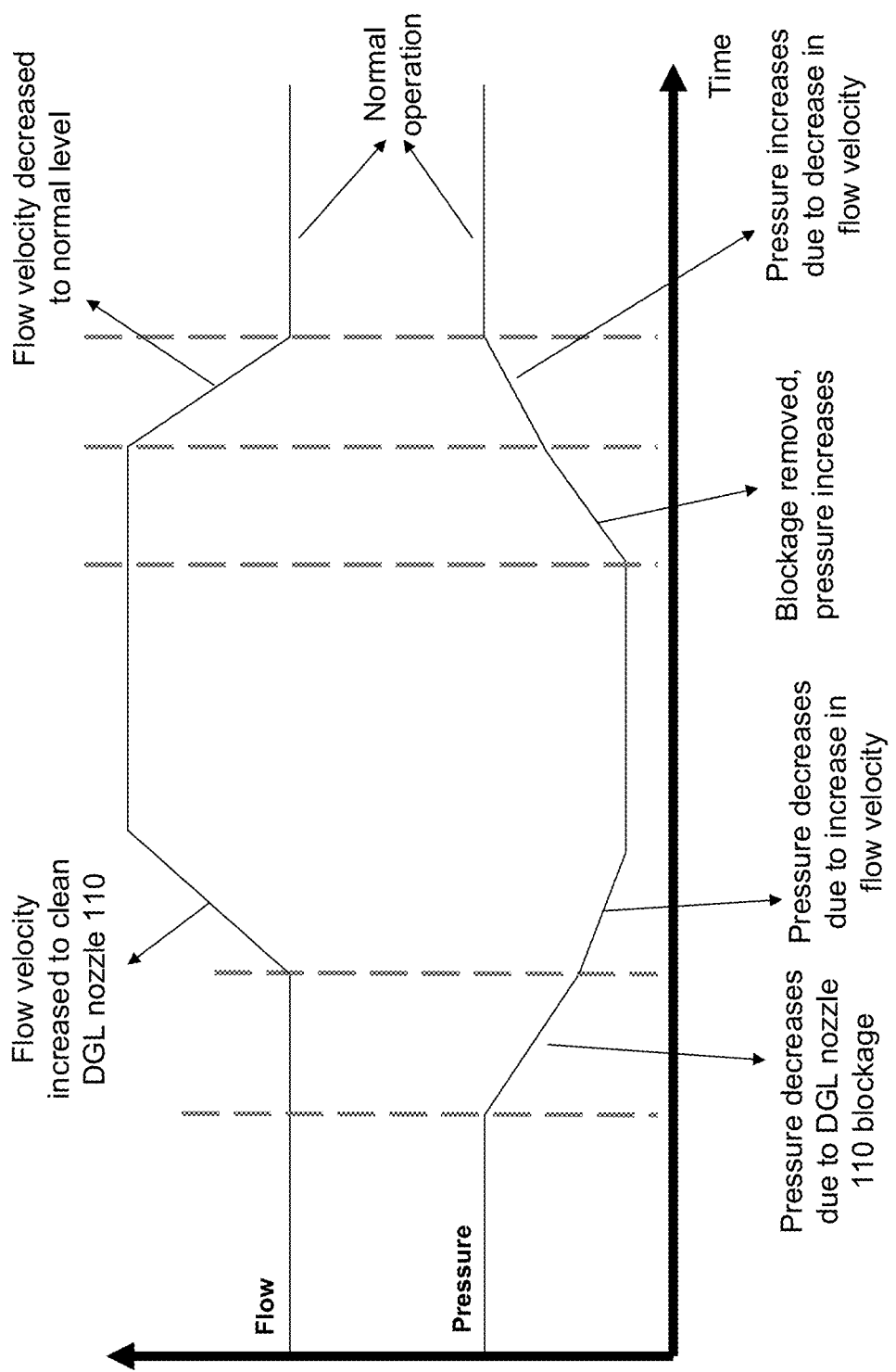
Figure 3C:
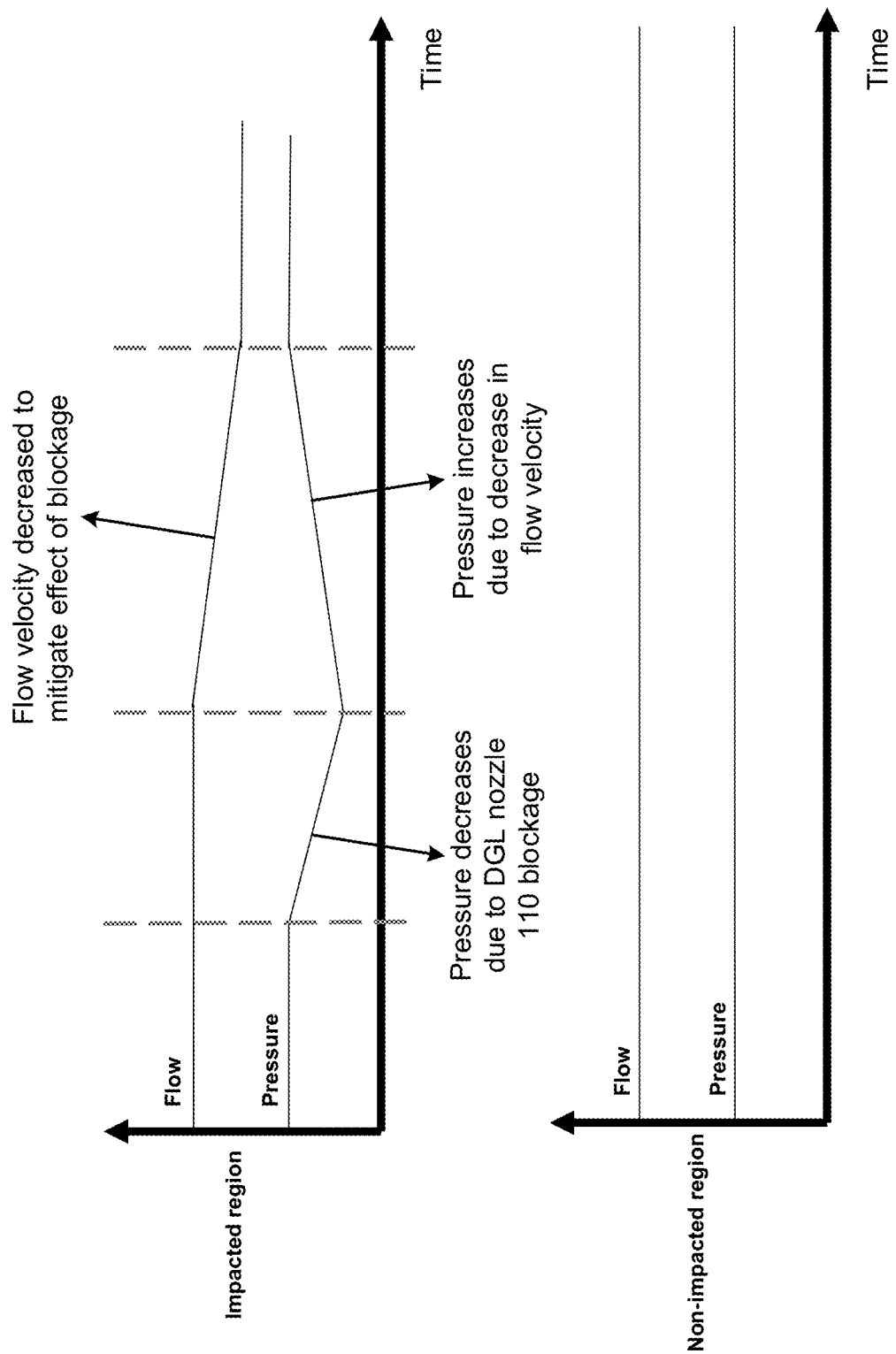

FIGS. 3A-3C are diagrams illustrating embodiments of operations performed by the control system 200 in association with reducing or preventing particle accumulation, as described herein. FIG. 3A illustrates a generic example 300 of operations performed by the control system 200 in association with controlling flow velocities in DGL nozzle control regions 210, while FIGS. 3B and 3C illustrate particular examples associated with removing, mitigating, reducing, or preventing blockage of a DGL nozzle 110 of the IF cap 106.

As shown by reference 302 in FIG. 3A, in an example 300, the controller 208 receives a plurality of signals. Here each signal of the plurality of signals indicates a respective pressure detected by a corresponding pressure sensor 202 of a plurality of pressure sensors 202. In some implementations, a given pressure sensor 202 provides a signal (automatically) on a periodic basis (e.g., when the pressure sensor 202 is configured to provide the signal at a particular interval). In some implementations, a given pressure sensor 202 provides a signal based on a request from the controller 208 (e.g., when the controller 208 transmits a request to the pressure sensor 202 for a pressure measurement). In some implementations, the controller 208 receives the plurality of signals over a period of time (e.g., when the pressure sensors 202 are configured to provide signals in a sequential manner such that the controller 208 receives the plurality of signals one at a time over a particular time window).

In some implementations, the controller 208 determines whether one or more DGL nozzles 110 of the IF cap 106 are at least partially blocked based on the pressures indicated by the signals from the plurality of pressure sensors 202.

The flow continuity rule states that $\rho A_1 V_1 = \rho A_2 V_2$, where $A_1$ and $A_2$ represent cross-sectional areas at exits of a given pair of DGL nozzles 110, $V_1$ and $V_2$ represent flow velocities at the exits of the pair of DGL nozzles 110, and $\rho$ is a mass density of the fluid 160. The flow continuity rule indicates that if one of the DGL nozzles 110 is at least partially blocked (e.g., by particle deposition), then the flow velocity at the exit of that DGL nozzle 110 will increase as compared to the flow velocity at the unblocked DGL nozzle 110 (e.g., if $A_1$ decreases as compared to $A_2$, then $V_1$ increases as compared to $V_2$). As the flow velocity changes, Bernoulli's law can be applied for the flow field to determine the pressure change: $P_1 + \frac{1}{2}\rho V_1^2 + gh_1 = P_2 + \frac{1}{2}\rho V_2^2 + gh_2$, where $P_1$ and $P_2$ represent pressure at the exits of the pair of DGL nozzles 110, g is acceleration due to gravity, and $h_1$ and $h_2$ represent heights of the exits of the pair of DGL nozzles 110. Accordingly, if the flow velocity at the exit of one of the DGL nozzles 110 increases as compared to the flow velocity at the exit of the other DGL nozzle 110, then the pressure at the exit of that DGL nozzle 110 will decrease as compared to the pressure at the exit of the other DGL nozzle (e.g., if $V_1$ increases as compared to $V_2$, then $P_1$ decreases as compared to $P_2$). Here, since the manifolds 204 that supply the fluid 160 share the same gas source, the manifolds 204 share the same total pressure, meaning that whether a particular DGL nozzle 110 is partially block can be determined based on comparing a pressure detected at the exit of the DGL nozzle 110 to the pressure at the exit of another DGL nozzle 110.

Therefore, in some implementations, the controller 208 determines whether a DGL nozzle 110 is at least partially blocked based on a pressure detected by a pressure sensor 202 associated with the DGL nozzle 110 (e.g., a DGL nozzle 110 at which the pressure sensor 202 is installed). For example, the controller 208 may receive a first signal from a first pressure sensor 202 associated with a first DGL nozzle 110 included in a first DGL nozzle control region 210, where the first signal indicates a pressure measured at the first DGL nozzle 110 at a particular time. Similarly, the controller 208 may receive a second signal from a second pressure sensor 202 associated with a second DGL nozzle 110 included in a second DGL nozzle control region 210, where the second signal indicates a pressure measured at the second DGL nozzle 110 at the particular time. The controller 208 may then determine whether the pressure indicated by the first signal differs from the pressure indicated by the second signal by a threshold amount (e.g., 10% or more). Here, if the controller 208 determines the pressure indicated by the first signal differs from the pressure indicated by the second signal by the threshold amount (e.g., that the pressure at the first DGL nozzle 110 is at least 10% less than the pressure at the second DGL nozzle 110), then the controller 208 may determine that the first DGL nozzle 110 is at least partially blocked. Conversely, if the controller 208 determines the pressure indicated by the first signal does not differ from the pressure indicated by the second signal by the threshold amount (e.g., that the pressure at the first DGL nozzle 110 differs from the pressure at the second DGL nozzle 110 by less than 10%), then the controller 208 may determine that the first DGL nozzle 110 and the second DGL nozzle 110 are not blocked. In some implementations, the controller 208 may perform one or more additional comparisons of the pressure at the first DGL nozzle 110 and/or the pressure at the second DGL nozzle 110 to pressures at one or more other DGL nozzles 110 (e.g., a third DGL nozzle 110, a fourth DGL nozzle 110, and so on) in order to confirm a determination of whether the first DGL nozzle 110 or the second DGL nozzle 110 is at least partially blocked or is unblocked.

Notably, in the above example, the controller 208 compares a pressure at a first DGL nozzle 110 to a pressure at a second DGL nozzle 110 in order to determine whether the first DGL nozzle 110 or the second DGL nozzle 110 is blocked. However, in some implementations, the controller 208 may be configured to determine whether a given DGL nozzle 110 is blocked in another manner, such as by comparing a pressure at the particular DGL nozzle 110 to a reference pressure (e.g., a pressure expected by the control system 200, a pressure measured at a DGL nozzle 110 known to be unblocked, an average pressure calculated from pressures at all or a particular subset of the DGL nozzles 110, a pressure measured at the particular DGL nozzle 110 at an earlier point in time, or the like). In some implementations, the controller 208 makes a similar determination for each DGL nozzle 110 of the IF cap 106 (e.g., in a particular sequence, in a random order, in a group concurrently, or the like).

As further shown in FIG. 3A by reference 304, in example 300, the controller 208 determines, based on the plurality of signals, that a particular DGL nozzle 110 of the IF cap 106 is at least partially blocked.

As shown by reference 306, based on the determination that the particular DGL nozzle 110 is at least partially blocked, the controller 208 causes one or more MFCs 206 to adjust flow velocities in one or more DGL nozzle control regions 210.

In some implementations, the controller 208 causes a flow velocity in the DGL nozzle control region 210 which includes the particular DGL nozzle 110 that is at least partially blocked to be increased. FIG. 3B is a diagram illustrating an example timeline of a scenario in which the controller 208 causes a flow velocity in the DGL nozzle control region 210 which includes the particular DGL nozzle 110 that is at least partially blocked to be increased. For example, as indicated in FIG. 3B, the controller 208 may provide, to an MFC 206 that controls the flow velocity of the DGL nozzle control region 210, a signal indicating a mass flow rate that will cause the flow velocity to be increased. Here, the MFC 206 receives the signal from the controller 208 and adjusts the mass flow rate accordingly (e.g., by increasing an open ratio of the MFC 206 so that the flow velocity is increased in the DGL nozzle control region 210). In some implementations, the controller 208 causes the flow velocity to be increased in the DGL nozzle control region 210 in order to attempt to blow away the blockage of the DGL nozzle 110. In some implementations, the controller 208 may cause flow velocities in one or more other DGL nozzle control regions 210 to be decreased (e.g., by decreasing the open ratios of the one or more other MFCs 206) during the attempt at blowing away the blockage of the DGL nozzle 110 (e.g., to enable the flow velocity to be increased in the DGL nozzle control region 210 with the blocked DGL nozzle 110). In this example, the controller 208 may receive (e.g., at a later time) another signal indicating another pressure detected by the pressure sensor 202 associated with the particular DGL nozzle 110 that was at least partially blocked. Here, the controller 208 may determine, based on the other pressure, whether the particular DGL nozzle 110 remains at least partially blocked. If the particular DGL nozzle 110 is no longer blocked, then the controller 208 may cause one or more MFCs 206 to adjust flow velocities in the DGL nozzle control regions 210 such that the flow velocities return to a particular level (e.g., such that the flow velocity in the DGL nozzle control region 210 with the now unblocked DGL nozzle 110 returns to a normal operating level). In this way, the controller 208 may attempt to reduce or remove a blockage detected by the control system 200.

In some implementations, the controller 208 causes a flow velocity, in the DGL nozzle control region 210 which includes the particular DGL nozzle 110 that is at least partially blocked, to be decreased. FIG. 3C is a diagram illustrating an example timeline of a scenario in which the controller 208 causes a flow velocity in the DGL nozzle control region 210 which includes the particular DGL nozzle 110 that is at least partially blocked to be decreased. For example, as indicated in FIG. 3C, the controller 208 may provide, to an MFC 206 that controls the flow velocity of the DGL nozzle control region 210, a signal indicating a mass flow rate that will cause the flow velocity to be decreased. Here, the MFC 206 receives the signal from the controller 208 and adjusts the mass flow rate accordingly (e.g., by decreasing an open ratio of the MFC 206 so that the flow velocity is decreased in the DGL nozzle control region 210). In some implementations, the controller 208 causes the flow velocity to be decreased in the DGL nozzle control region 210 with the particular DGL nozzle 110 that is at least partially blocked in order to prevent worsening of asymmetric particle deposition. Here, the controller 208 may cause the flow velocity to be decreased such that the pressure at the DGL nozzle 110 matches a pressure at an unblocked DGL nozzle 110 in another DGL nozzle control region 210. Notably, in this example, the controller 208 does not remove the blockage. Rather, the controller 208 attempts to mitigate an impact of the blockage to prevent further worsening of asymmetric deposition. In some implementations, the controller 208 may implement this mitigation technique after an unsuccessful attempt of blowing away the blockage in the manner described in the example above. That is, in some implementations, the controller 208 causes the flow velocity in the DGL nozzle control region 210 including the particular DGL nozzle 110 that is at least partially blocked to be decreased after the controller 208 causes the flow velocity in the DGL nozzle control region 210 to be increased.

In this way, the controller 208 can selectively cause one or more MFCs 206 to adjust flow velocities in one or more DGL nozzle control regions 210 based on pressures detected by pressure sensors 202 in the DGL nozzle control regions 210.

As indicated above, FIGS. 3A-3C are provided as examples. Other examples may differ from what is described with regard to FIGS. 3A-3C.

Notably, a first group of pressure sensors 202 included in the DGL nozzle control regions 210 and a second group of pressure sensors 202 included in the DGL nozzle control regions 210 are at different distances from outlets of the manifolds 204. As a result, pressure detected by a pressure sensor 202 in the first group may be slightly different than a pressure detected by a pressure sensor 202 in the second group, even when no DGL nozzle 110 blockage is present. In such a case, these groupings of pressure sensors 202 can be accounted for in comparisons of detected pressures (e.g., in the manner described above with respect to FIG. 3A).

Figure 4:
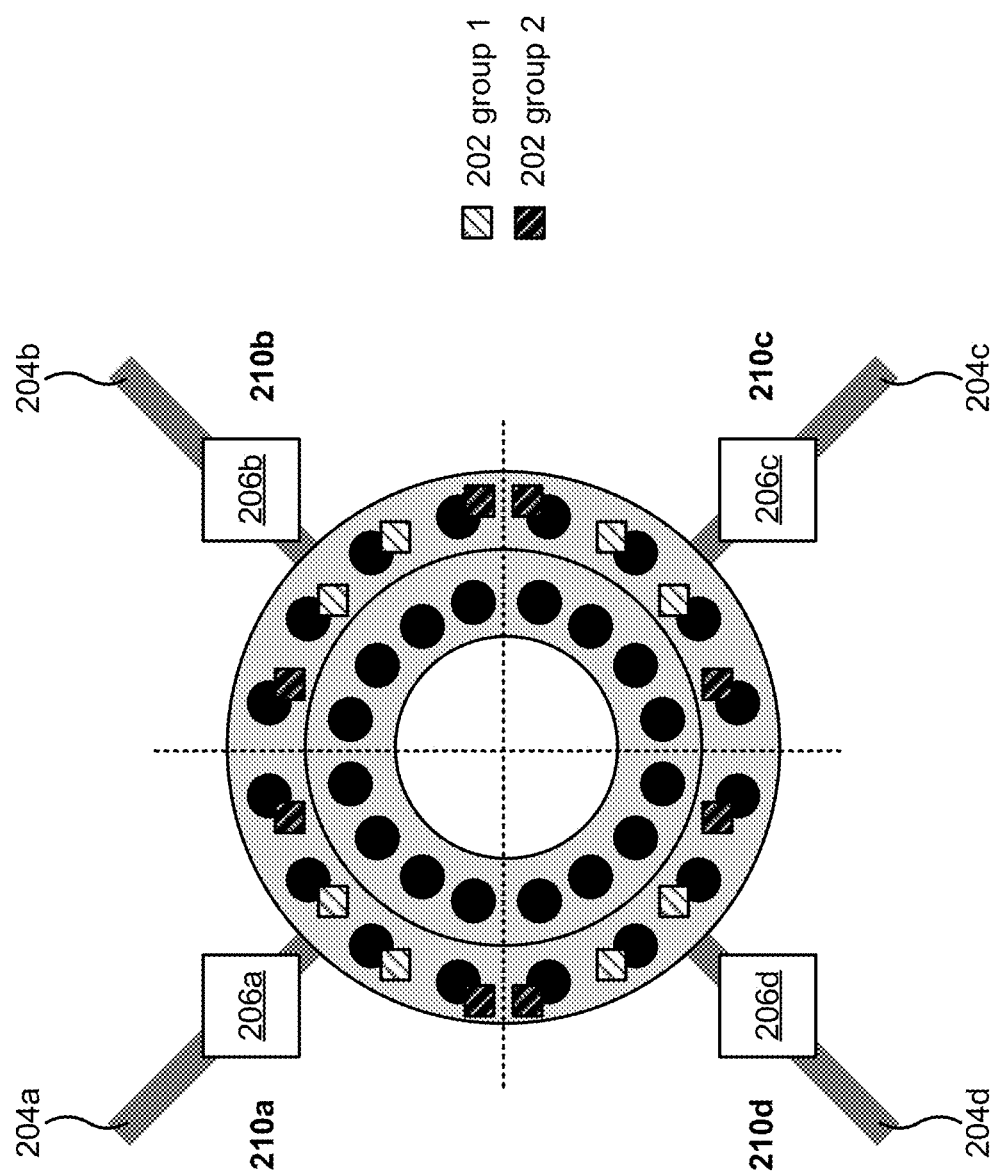
FIG. 4 is a diagram illustrating an embodiment of separation of pressures sensors of the control system into multiple sensor groups.

FIG. 4 is a diagram illustrating an embodiment of separation of pressures sensors 202 of the control system 200 into multiple sensor groups. In FIG. 4, each pressure sensor 202 in a first group of pressure sensors 202 (identified as 202 group 1) is at substantially the same distance from an outlet of a given manifold 204 (e.g., pressure sensors 202 in the first group are pressure sensors 202 that are closest to outlets of the manifolds 204). Similarly, each pressure sensor 202 in a second group of pressure sensors 202 (identified as 202 group 2) is at substantially the same distance from an outlet of a given manifold 204 (e.g., pressure sensors 202 in the second group are pressure sensors 202 that are furthest from outlets of the manifolds 204). Here, the control system 200 may be configured such that a pressure detected by a pressure sensor 202 in a particular group is compared only to pressures detected by pressure sensors 202 in the particular group. For example, a pressure indicated by a pressure sensor 202 in the first group may be compared only to pressures indicated by other pressure sensors 202 in the first group in association with detecting a blockage, and a pressure indicated by a pressure sensor 202 in the second group may be compared only to pressures indicated by other pressure sensors 202 in the second group in association with detecting a blockage. In this way, accuracy or reliability of detection of a blockage of a given DGL nozzle 110 can be increased.

As indicated above, FIG. 4 is provided as an example. Other examples may differ from what is described with regard to FIG. 4.

In the examples described above, the IF cap 106 includes 16 DGL nozzles 110, 16 DGL nozzles 112, and four fluid channels 116. Further, the control system 200 includes 16 pressure sensors 202 (one for each DGL nozzle 110), four manifolds 204 (one for each fluid channel 116), and four DGL nozzle control regions 210 (each including four DGL nozzles 110). These quantities are provided for illustrative purposes. In practice, other quantities of one, more, or all of these components may be used with an IF cap 106 and/or a control system 200.

FIGS. 5A-5E are diagrams of additional embodiments of the IF cap 106 and the control system 200 described herein.

Figure 5A:
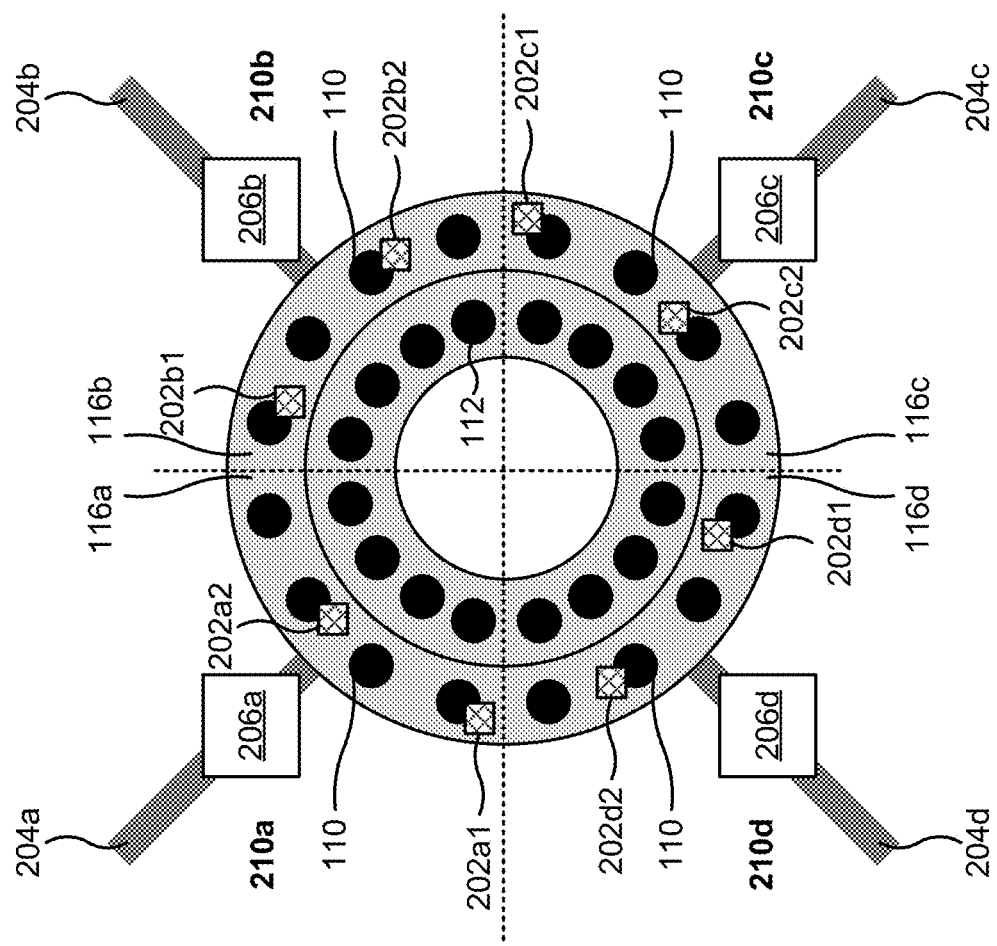
FIGS. 5A-5E are diagrams of additional embodiments of the IF cap and the control system described herein.

In the example shown in FIG. 5A, the IF cap 106 includes 16 DGL nozzles 110, 16 DGL nozzles 112, and four fluid channels 116. Further, the control system 200 includes eight pressure sensors 202 (one for every other DGL nozzle 110), four manifolds 204 (one for each fluid channel 116), and four DGL nozzle control regions 210 (each including four DGL nozzles 110). In this implementation, blockage is monitored at half of the DGL nozzles 110. In such a case, a state (e.g., unblocked or at least partially blocked) of a given DGL nozzle 110 without a pressure sensor 202 may be assumed to be similar to that of a neighboring DGL nozzle 110 with a pressure sensor 202. An implementation such as that shown in FIG. 5A (e.g., an implementation with a smaller quantity of pressure sensors 202 than DGL nozzles 110) reduces complexity and cost of the control system 200, thereby increasing manufacturability.

Figure 5B:
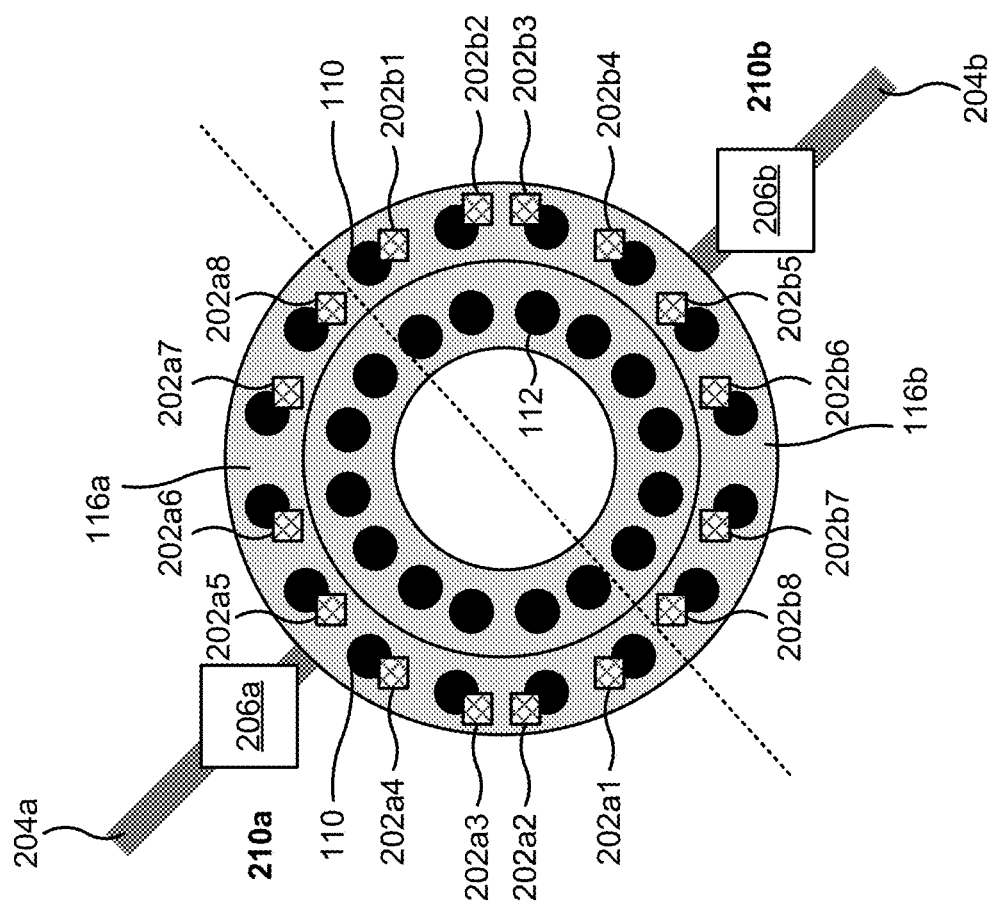

In the example shown in FIG. 5B, the IF cap 106 includes 16 DGL nozzles 110, 16 DGL nozzles 112, and two fluid channels 116. Further, the control system 200 includes 16 pressure sensors 202 including pressure sensors 202a1-202a8 and pressure sensors 202b1-202b8 (one for each DGL nozzle 110), two manifolds 204 (one for each fluid channel 116), and two DGL nozzle control regions 210 (each including eight DGL nozzles 110). In this implementation, flow velocity is independently controlled for each half of the group of DGL nozzles 110. An implementation such as that shown in FIG. 5B (e.g., an implementation with a comparatively smaller quantity of fluid channels 116, manifolds 204, and DGL nozzle control regions 210 than shown in the implementation in FIG. 2B) reduces complexity and cost of the control system 200, thereby increasing manufacturability.

Figure 5C:
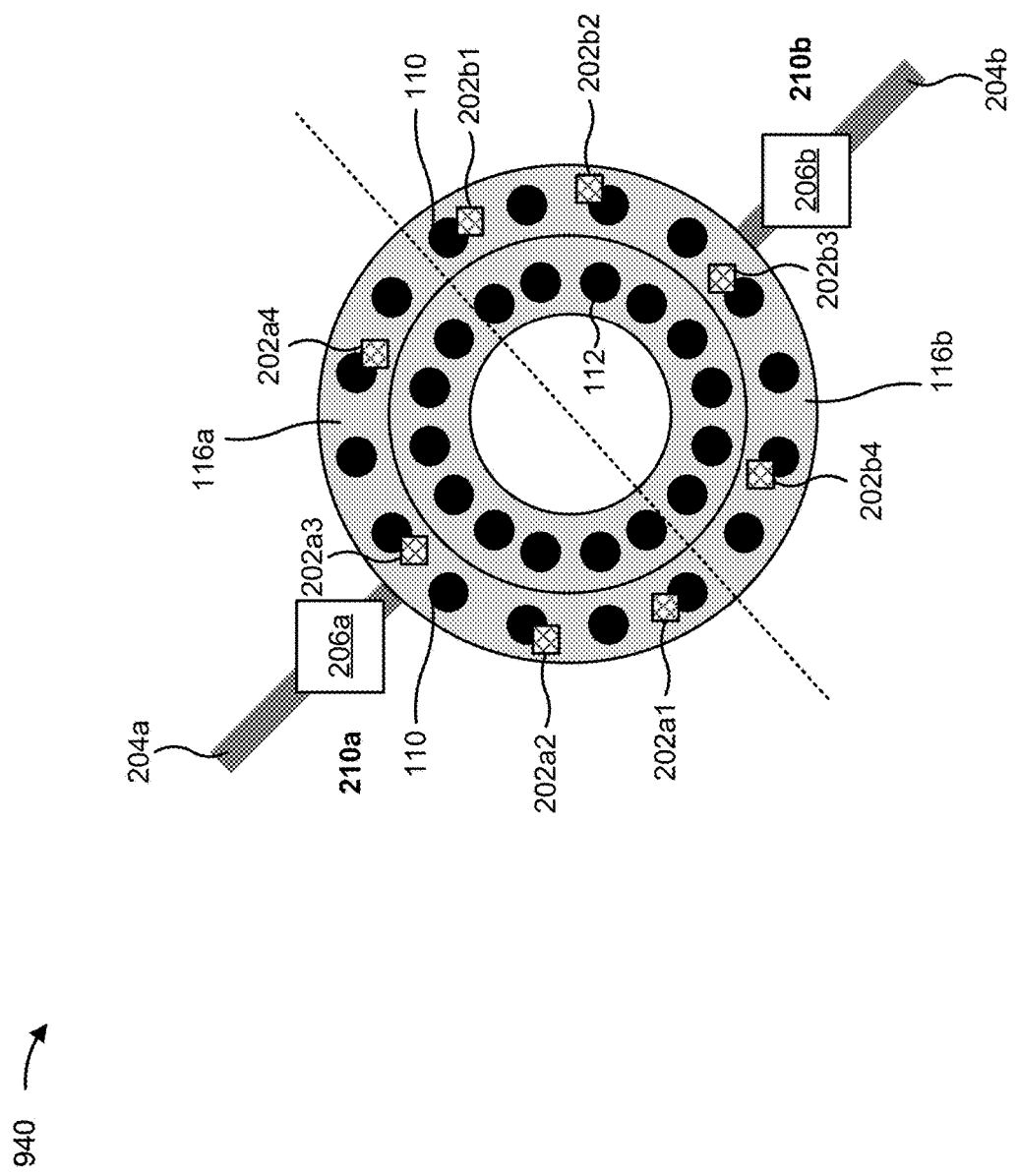

In the example shown in FIG. 5C, the IF cap 106 includes 16 DGL nozzles 110, 16 DGL nozzles 112, and two fluid channels 116. Further, the control system 200 includes eight pressure sensors 202 (one for every other DGL nozzle 110), two manifolds 204 (one for each fluid channel 116), and two DGL nozzle control regions 210 (each including eight DGL nozzles 110). In this implementation, blockage is monitored at half of the DGL nozzles 110. In such a case, a state (e.g., unblocked or at least partially blocked) of a given DGL nozzle 110 without a pressure sensor 202 may be assumed to be similar to that of a neighboring DGL nozzle 110 with a pressure sensor 202. Further, flow velocity is independently controlled for each half of the group of DGL nozzles 110. An implementation such as that shown in FIG. 5C (e.g., an implementation with a smaller quantity of pressure sensors 202 than DGL nozzles 110 and a comparatively smaller quantity of fluid channels 116, manifolds 204, and DGL nozzle control regions 210 than shown in the implementation in FIG. 2B) reduces complexity and cost of the control system 200, thereby increasing manufacturability.

Figure 5D:
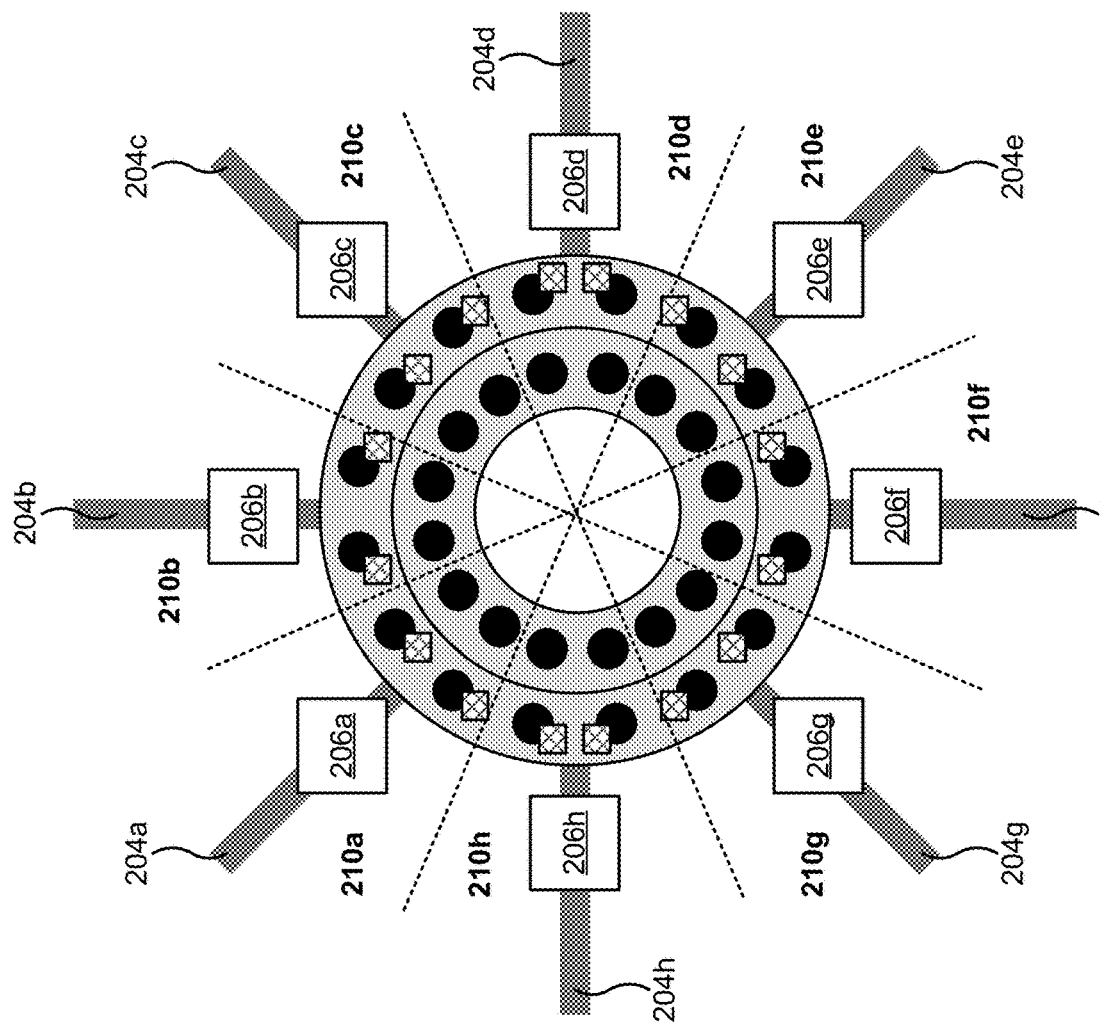

In the example shown in FIG. 5D, the IF cap 106 includes 16 DGL nozzles 110, 16 DGL nozzles 112, and eight fluid channels 116. Further, the control system 200 includes 16 pressure sensors 202 (one for every DGL nozzle 110), eight manifolds 204 including manifolds 204a-204h (one for each fluid channel 116), eight MFCs 206 including MFCs 206a-206h, and eight DGL nozzle control regions 210 including DGL nozzle control regions 210a-210h (each including two DGL nozzles 110). Notably, for purposes of clarity, some components in the example shown in FIG. 5D are not labeled. In this implementation, flow velocity is independently controlled for each pair DGL nozzles 110 in the group of DGL nozzles 110. An implementation such as that shown in FIG. 5D (e.g., an implementation with a comparatively larger quantity of manifolds 204 and DGL nozzle control regions 210 than shown in the implementation in FIG. 2B) increases precision in control of the flow field, meaning that performance of the DGL can be improved.

Figure 5E:
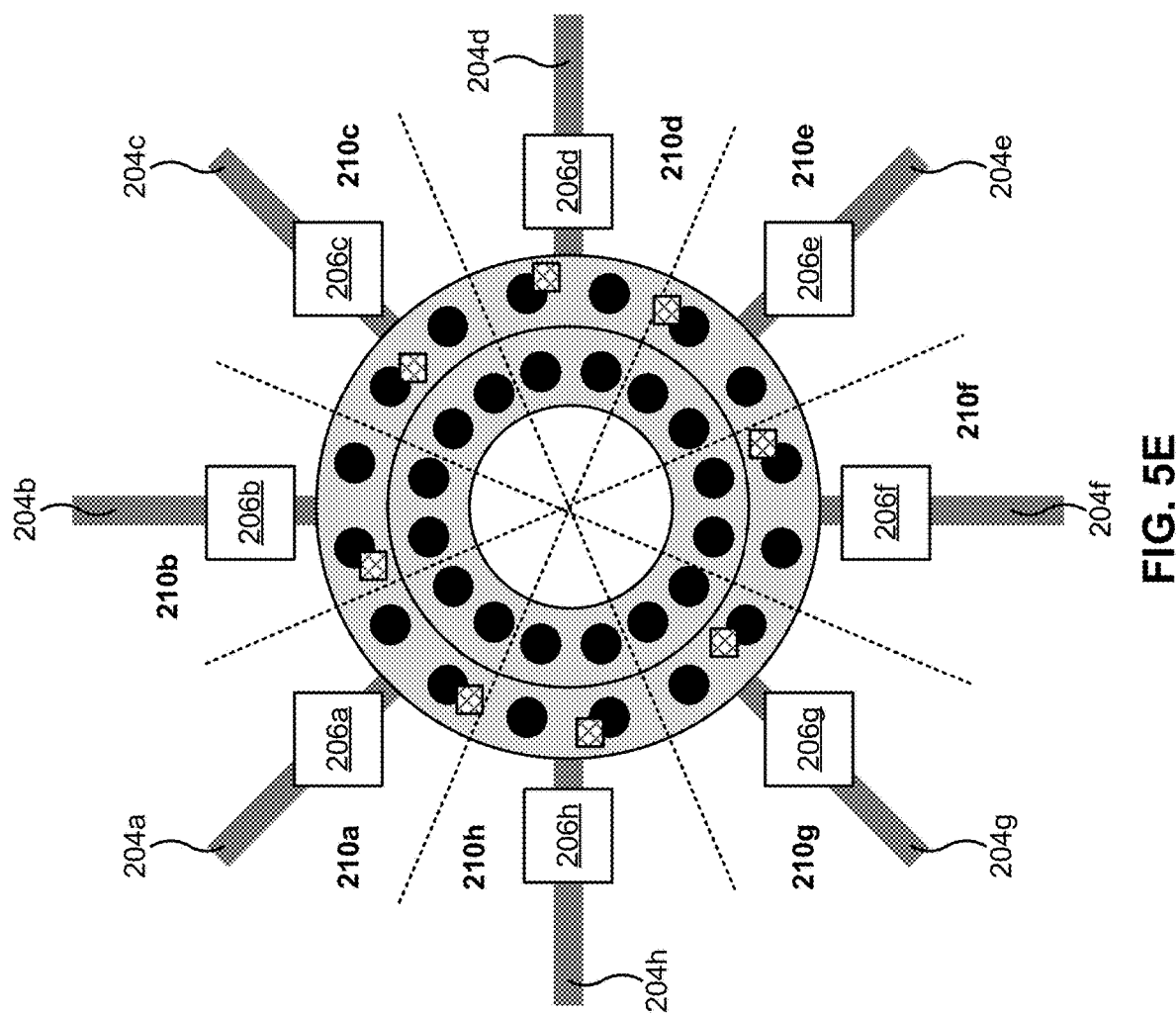

In the example shown in FIG. 5E, the IF cap 106 includes 16 DGL nozzles 110, 16 DGL nozzles 112, and eight fluid channels 116. Further, the control system 200 includes eight pressure sensors 202 (one for every other DGL nozzle 110), eight manifolds 204 (one for each fluid channel 116), and eight DGL nozzle control regions 210 (each including two DGL nozzles 110). Notably, for purposes of clarity, some components in the example shown in FIG. 5E are not labeled. In this implementation, flow velocity is independently controlled for each pair DGL nozzles 110 in the group of DGL nozzles 110. An implementation such as that shown in FIG. 5E (e.g., an implementation with a smaller quantity of pressure sensors 202 than DGL nozzles 110 and a comparatively larger quantity of manifolds 204 and DGL nozzle control regions 210 than shown in the implementation in FIG. 2B) increases precision in control of the flow field, meaning that performance of the DGL can be improved while mitigating a cost increase (e.g., by utilizing fewer pressure sensors 202).

As indicated above, FIGS. 5A-5E are provided as examples. Other examples may differ from what is described with regard to FIGS. 5A-5E. The number and arrangement of components shown in FIGS. 5A-5E are provided as an example. In practice, there may be additional components, fewer components, different components, or differently arranged components than those shown in FIGS. 5A-5E.

Figure 6:
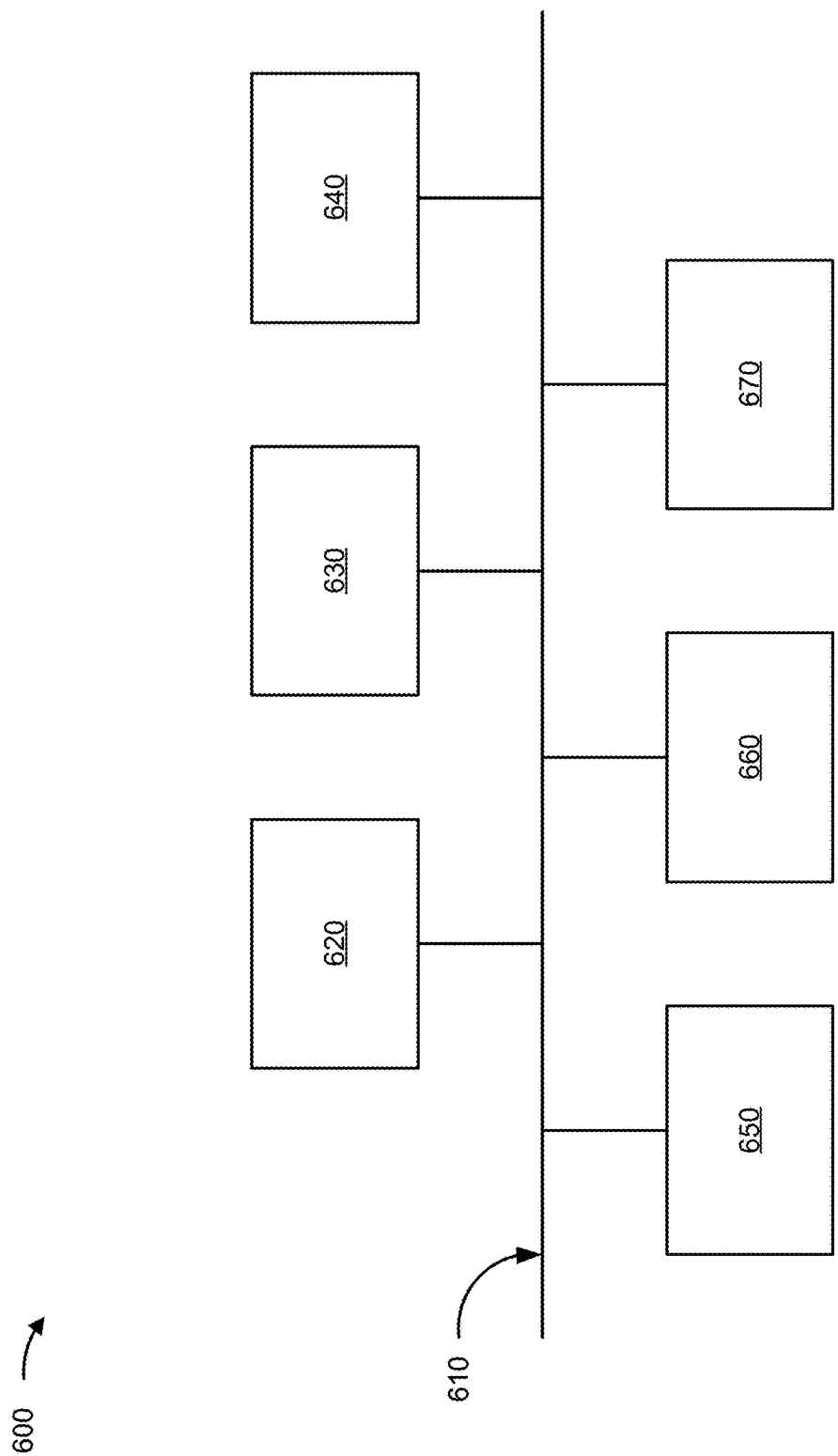
FIG. 6 is a diagram of embodiments of components of one or more devices of the control system.

FIG. 6 is a diagram of an embodiment of components of one or more devices of the control system 200. FIG. 6 is a diagram of example components of a device 600, which may correspond to one or more pressure sensors 202, one or more MFCs 206, and/or the controller 208. In some implementations, one or more pressure sensors 202, one or more MFCs 206, and/or the controller 208 may include one or more devices 600 and/or one or more components of device 600. As shown in FIG. 6, device 600 may include a bus 610, a processor 620, a memory 630, a storage component 640, an input component 650, an output component 660, and a communication component 670.

Bus 610 includes a component that enables wired and/or wireless communication among the components of device 600. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform a function. Memory 630 includes a random access memory, a read only memory, and/or another type of memory (e.g., a flash memory, a magnetic memory, and/or an optical memory).

Storage component 640 stores information and/or software related to the operation of device 600. For example, storage component 640 may include a hard disk drive, a magnetic disk drive, an optical disk drive, a solid state disk drive, a compact disc, a digital versatile disc, and/or another type of non-transitory computer-readable medium. Input component 650 enables device 600 to receive input, such as user input and/or sensed inputs. For example, input component 650 may include a touch screen, a keyboard, a keypad, a mouse, a button, a microphone, a switch, a sensor, a global positioning system component, an accelerometer, a gyroscope, and/or an actuator. Output component 660 enables device 600 to provide output, such as via a display, a speaker, and/or one or more light-emitting diodes. Communication component 670 enables device 600 to communicate with other devices, such as via a wired connection and/or a wireless connection. For example, communication component 670 may include a receiver, a transmitter, a transceiver, a modem, a network interface card, and/or an antenna.

Device 600 may perform one or more processes described herein. For example, a non-transitory computer-readable medium (e.g., memory 630 and/or storage component 640) may store a set of instructions (e.g., one or more instructions, code, software code, and/or program code) for execution by processor 620. Processor 620 may execute the set of instructions to perform one or more processes described herein. In some implementations, execution of the set of instructions, by one or more processors 620, causes the one or more processors 620 and/or the device 600 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
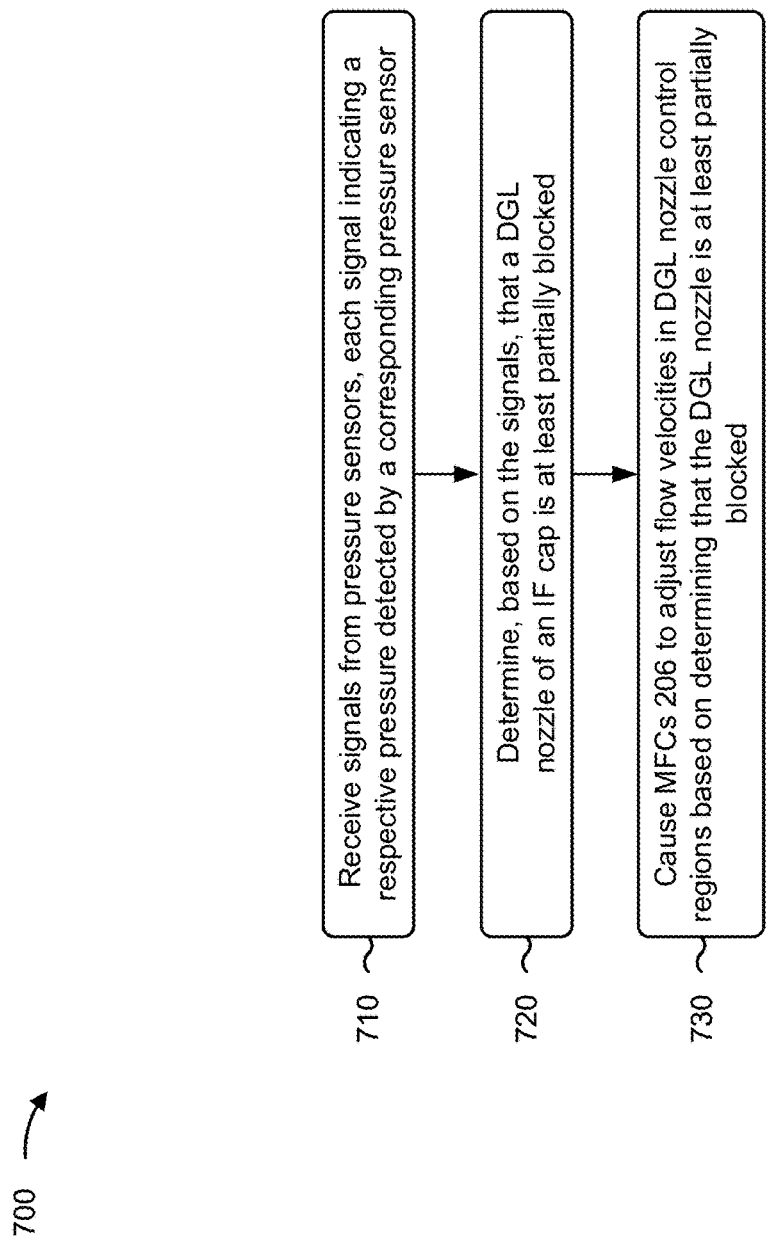
FIG. 7 is a flowchart of an embodiment of a process relating to improved control of flow velocity at DGL nozzles of an IF cap.

FIG. 7 is a flowchart of an embodiment of a process 700 relating to improved control of flow velocity at DGL nozzles of an IF cap. In some implementations, one or more process blocks of FIG. 7 may be performed by a controller (e.g., the controller 208). In some implementations, one or more process blocks of FIG. 7 may be performed by another device or a group of devices separate from or including the controller, such as one or more pressure sensors (e.g., one or more pressure sensors 202) and/or one or more MFCs (e.g., one or more MFCs 206). Additionally, or alternatively, one or more process blocks of FIG. 7 may be performed by one or more components of device 600, such as processor 620, memory 630, storage component 640, input component 650, output component 660, and/or communication component 670.

As shown in FIG. 7, process 700 may include receiving a plurality of signals from a plurality of pressure sensors (block 710). For example, the controller 208 may receive a plurality of signals from a plurality of pressure sensors 202, as described above. In some implementations, each signal of the plurality of signals indicates a respective pressure detected by a corresponding pressure sensor 202 of the plurality of pressure sensors 202.

As further shown in FIG. 7, process 700 may include determining, based on the plurality of signals, that a DGL nozzle of a plurality of DGL nozzles of an IF cap is at least partially blocked (block 720). For example, the controller 208 may determine, based on the plurality of signals, that a DGL nozzle 110 of a plurality of DGL nozzles 110 of an IF cap 106 is at least partially blocked, as described above.

As further shown in FIG. 7, process 700 may include causing one or more MFCs of a plurality of MFCs to adjust flow velocities in one or more DGL nozzle control regions of a plurality of DGL nozzle control regions based on determining that the DGL nozzle is at least partially blocked (block 730). For example, the controller 208 may cause one or more MFCs 206 of a plurality of MFCs 206 to adjust flow velocities in one or more DGL nozzle control regions 210 of a plurality of DGL nozzle control regions 210 based on determining that the DGL nozzle 110 is at least partially blocked, as described above. In some implementations, the DGL nozzle 110 that is at least partially blocked is included in a DGL nozzle control region 210 of the plurality of DGL nozzle control regions 210. In some implementations, each MFC 206 of the plurality of MFCs 260 is associated with a respective DGL nozzle control region 210 of the plurality of DGL nozzle control regions 210.

Process 700 may include additional implementations, such as any single implementation or any combination of implementations described below and/or in connection with one or more other processes described elsewhere herein.

In a first implementation, the controller 208 is configured to cause the flow velocity in the DGL nozzle control region 210, which includes the DGL nozzle 110 that is at least partially blocked, to be increased by causing the one or more MFCs 206 to adjust the flow velocities in the one or more DGL nozzle control regions 210.

In a second implementation, alone or in combination with the first implementation, process 700 includes determining that the DGL nozzle 110, which was at least partially blocked, is no longer blocked, and causing the one or more MFCs 206 to adjust the flow velocities in the one or more DGL nozzle control regions 210 such that the flow velocity in the DGL nozzle control region 210, which includes the DGL nozzle 110 that is no longer blocked, is at a particular level.

In a third implementation, alone or in combination with one or more of the first and second implementations, the controller 208 is configured to cause the flow velocity in the DGL nozzle control region 210, which includes the DGL nozzle 110 that is at least partially blocked, to be decreased by causing the one or more MFCs 206 to adjust the flow velocities in the one or more DGL nozzle control regions 210.

In a fourth implementation, alone or in combination with the third implementation, the controller 208 is configured to cause the flow velocity in the DGL nozzle control region 210, which includes the DGL nozzle 110 that is at least partially blocked, to be decreased after causing the one or more MFCs 206 to increase the flow velocity in the DGL nozzle control region 210 that includes the DGL nozzle 110 that is at least partially blocked.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8:
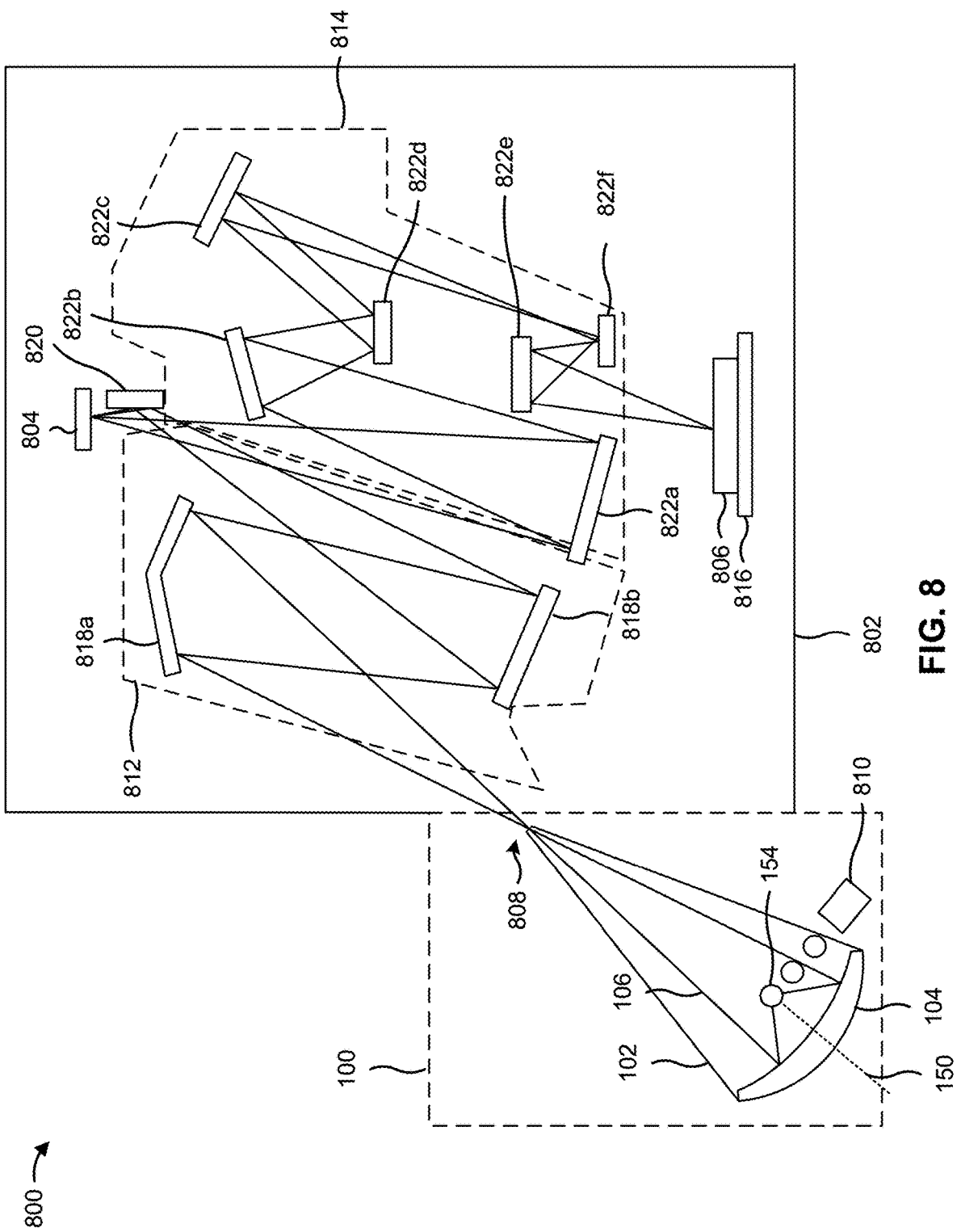
FIG. 8 is a diagram of an embodiment lithography system described herein.

FIG. 8 is a diagram of an embodiment of a lithography system 800 described herein. The lithography system 800 includes an EUV lithography system or another type of lithography system that is configured to transfer a pattern to a semiconductor substrate using mirror-based optics. The lithography system 800 may be configured for use in a semiconductor processing environment such as a semiconductor foundry or a semiconductor fabrication facility.

As shown in FIG. 8, the lithography system 800 includes the radiation source 100 and an exposure tool 802. The radiation source 100 (e.g., an EUV radiation source or another type of radiation source) is configured to generate the radiation 158 such as EUV radiation and/or another type of electromagnetic radiation (e.g., light). The exposure tool 802 (e.g., an EUV scanner or another type of exposure tool) is configured to focus the radiation 158 onto a reflective reticle 804 (or a photomask) such that a pattern is transferred from the reticle 804 onto a semiconductor substrate 806 using the radiation 158.

The collector 104 or the radiation source includes a curved mirror that is configured to collect the radiation 158 generated by the radiation source 100 and to focus the radiation 158 toward an intermediate focus 808. The radiation 158 is produced from a plasma (e.g., the plasma 154) that is generated by the target material 152 (e.g., tin (Sn) droplets or another type of droplets) being exposed to a laser beam 150. The target material 152 is provided across the front of the collector 104 by a droplet generator (DG) head 810. The DG head 810 is pressurized to provide a fine and controlled output of the target material 152. The laser beam 150 is provided through an opening such that the plasma is generated in front of the collector 104. The laser beam 150 is pulsed at a timing that is synchronized with the flow of the source material 152 from the DG head 810.

The exposure tool 802 includes an illuminator 812 and a projection optics box (POB) 814. The projection optics box 814 includes a plurality of mirrors that are configured to project the radiation 158 onto the semiconductor substrate 806 after the radiation 152 is modified based on the pattern of the reticle 804. The exposure tool 802 includes a substrate stage 816 (e.g., a wafer stage) configured to support the semiconductor substrate 806. Moreover, the substrate stage 816 is configured to move (or step) the semiconductor substrate 806 through a plurality of exposure fields as the radiation 158 transfers the pattern from the reticle 804 onto the semiconductor substrate 806.

In some implementations, the exposure tool 802 includes a reticle stage (not shown) that configured to support and/or secure the reticle 804. Moreover, the reticle stage is configured to move or slide the reticle through the radiation 158 such that the reticle 804 is scanned by the radiation 158. In this way, a pattern that is larger than the field or beam of the radiation 158 may be transferred to the semiconductor substrate 806.

The illuminator 812 includes a plurality of reflective mirrors that are configured to focus and/or direct the radiation 158 onto the reticle 804 so as to illuminate the pattern on the reticle 804. The illuminator 812 includes a mirror 818a and a mirror 818b. The mirror 818a includes a field facet mirror (FFM) or another type of mirror that includes a plurality of field facets. The mirror 818b includes a pupil facet mirror (PFM) or another type of mirror that also includes a plurality of pupil facets. The facets of the mirrors 818a and 818b are arranged to focus, polarize, and/or otherwise tune the radiation 158 from the radiation source 100 to increase the uniformity of the radiation 158 and/or to increase particular types of radiation components (e.g., transverse electric (TE) polarized radiation, transverse magnetic (TM) polarized radiation).

Another mirror 818 (e.g., a relay mirror) is included to direct radiation 158 from the illuminator 812 onto the reticle 804. The projection optics box 814 includes a plurality of reflective mirrors such as the mirrors 822a-822f. In some implementations, the mirrors 822a-822f are configured to focus or reduce the radiation 158 into an exposure field, which may include one or more die areas on the semiconductor substrate 806.

In an example exposure operation (e.g., an EUV exposure operation), the DG head 810 provides the stream of the target material 152 across the front of the collector 104. The laser beam 150 contacts the source material 152, which causes a plasma 154 to be generated. The plasma 154 emits or produces the radiation 158 (e.g., EUV light). The radiation 158 is collected by the collector 104 and directed out of the radiation source 100 and into the exposure tool 802 toward the mirror 818a of the illuminator 812. The mirror 818a reflects the radiation 158 onto the mirror 818b, which reflects the radiation 158 onto the mirror 820 toward the reticle 804. The radiation 158 is modified by the pattern in the reticle 804. In other words, the radiation 158 reflects off of the reticle 804 based on the pattern of the reticle 804. The reflective reticle 804 directs the radiation 158 toward the mirror 822a in the projection optics box 814, which reflects the radiation 158 onto the mirror 822b. The radiation 158 continues to be reflected and reduced in the projection optics box 814 by the mirrors 822c-822f. The mirror 822f reflects the radiation 158 onto the semiconductor substrate 806 such that the pattern of the reticle 804 is transferred to the semiconductor substrate 806. The above-described exposure operation is an example, and the lithography system 800 may operate according to other EUV techniques and radiation paths that include a greater quantity of mirrors, a lesser quantity of mirrors, and/or a different configuration of mirrors.

As indicated above, FIG. 8 is provided as an example. Other examples may differ from what is described with regard to FIG. 8.

In this way, a control system may reduce or prevent asymmetric particle (e.g., Sn) deposition on a cone wall of a DGL of an IF cap by enabling improved control of flow velocity at DGL nozzles of the DGL. As a result, the control system described herein reduces a likelihood of particles being transported to a scanner toward a reticle, and thereby reduces a likelihood of forming defects, meaning that pattern quality and wafer yield are improved, and damage to a scanner is prevented.

As described in greater detail above, some implementations described herein provide an EUV source. The EUV source includes a plurality of DGL nozzles. The EUV source includes a plurality of pressure sensors, wherein each pressure sensor of the plurality of pressure sensors is to detect a pressure in a respective DGL nozzle control region of a plurality of DGL nozzle control regions, where each DGL nozzle control region includes a different set of DGL nozzles from the plurality of DGL nozzles, and where each pressure sensor of the plurality of pressure sensors is arranged at a different DGL nozzle of the plurality of DGL nozzles. The EUV source includes a plurality of mass flow controllers (MFCs), wherein each MFC of the plurality of MFCs is to control a flow velocity in a respective DGL nozzle control region of the plurality of DGL nozzle control regions, where each MFC of the plurality of MFCs is associated with a different DGL nozzle control region of the plurality of DGL nozzle control regions. The EUV source includes a plurality of manifolds, wherein each manifold is connected to a different DGL nozzle control region of the plurality of DGL nozzle control regions.

As described in greater detail above, some implementations described herein provide a method. The method includes receiving, by a controller associated with a radiation source, a plurality of signals from a plurality of pressure sensors, each signal of the plurality of signals indicating a respective pressure detected by a corresponding pressure sensor of the plurality of pressure sensors. The method includes determining, by the controller and based on the plurality of signals, that a DGL nozzle of a plurality of DGL nozzles of an IF cap is at least partially blocked. The method includes causing, by the controller, one or more MFCs of a plurality of MFCs to adjust flow velocities in one or more DGL nozzle control regions of a plurality of DGL nozzle control regions based on determining that the DGL nozzle is at least partially blocked, where the DGL nozzle that is at least partially blocked is included in a DGL nozzle control region of the plurality of DGL nozzle control regions, and where each MFC of the plurality of MFCs is associated with a respective DGL nozzle control region of the plurality of DGL nozzle control regions.

As described in greater detail above, some implementations described herein provide a radiation source. The radiation includes a plurality of pressure sensors, where each pressure sensor of the plurality of pressure sensors is positioned at a respective DGL nozzle of a plurality of DGL nozzles of an IF cap, where each pressure sensor of the plurality of pressure sensors is to provide a signal indicating a respective pressure at a corresponding DGL nozzle of the plurality of DGL nozzles. The radiation source includes a plurality of MFCs, where each MFC of the plurality of MFCs is to control a flow velocity in a respective DGL nozzle control region of a plurality of DGL nozzle control regions, where each DGL nozzle control region is associated with a respective subset of DGL nozzles from the plurality of DGL nozzles. The radiation source includes a plurality of manifolds, wherein each manifold of the plurality of manifolds is to provide a fluid to a respective DGL nozzle control region of the plurality of DGL nozzle control regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) source, comprising:
   a plurality of dynamic gas lock (DGL) nozzles;
   a plurality of pressure sensors, wherein each pressure sensor of the plurality of pressure sensors is to detect a pressure in a respective DGL nozzle control region of a plurality of DGL nozzle control regions,
      wherein each DGL nozzle control region includes a different set of DGL nozzles from the plurality of DGL nozzles, and
      wherein each pressure sensor of the plurality of pressure sensors is arranged at a different DGL nozzle of the plurality of DGL nozzles;
   a plurality of mass flow controllers (MFCs), wherein each MFC of the plurality of MFCs is to control a flow velocity in a respective DGL nozzle control region of the plurality of DGL nozzle control regions,
      wherein each MFC of the plurality of MFCs is associated with a different DGL nozzle control region of the plurality of DGL nozzle control regions; and
   a plurality of manifolds, wherein each manifold is connected to a different DGL nozzle control region of the plurality of DGL nozzle control regions.

2. The EUV source of claim 1, wherein the plurality of pressure sensors are installed at a first row of DGL nozzles of an intermediate focus (IF) cap of the EUV source.

3. The EUV source of claim 1, wherein a respective pressure sensor of the plurality of pressure sensors is installed at each DGL nozzle in a particular row of DGL nozzles of an intermediate focus (IF) cap.

4. The EUV source of claim 1, wherein each DGL nozzle control region of the plurality of DGL nozzle control regions includes a same quantity of DGL nozzles.

5. The EUV source of claim 1, wherein the plurality of DGL nozzle control regions includes at least four DGL nozzle control regions.

6. The EUV source of claim 1, wherein the plurality of manifolds includes at least four manifolds.

7. The EUV source of claim 1, wherein distances of fluid paths through each of the plurality of manifolds are substantially the same among the plurality of manifolds.

8. A method, comprising:
   receiving, by a controller associated with a radiation source, a plurality of signals from a plurality of pressure sensors, each signal of the plurality of signals indicating a respective pressure detected by a corresponding pressure sensor of the plurality of pressure sensors;
   determining, by the controller and based on the plurality of signals, that a dynamic gas lock (DGL) nozzle of a plurality of DGL nozzles of an intermediate focus (IF) cap is at least partially blocked; and
   causing, by the controller, one or more mass flow controllers (MFCs) of a plurality of MFCs to adjust flow velocities in one or more DGL nozzle control regions of a plurality of DGL nozzle control regions based on determining that the DGL nozzle is at least partially blocked,
   wherein the DGL nozzle that is at least partially blocked is included in a DGL nozzle control region of the plurality of DGL nozzle control regions, and
   wherein each MFC of the plurality of MFCs is associated with a respective DGL nozzle control region of the plurality of DGL nozzle control regions.

9. The method of claim 8, causing the flow velocity in the DGL nozzle control region, which includes the DGL nozzle that is at least partially blocked, to be increased comprises causing the one or more MFCs to adjust the flow velocities in the one or more DGL nozzle control regions.

10. The method of claim 9, further comprising:
   determining that the DGL nozzle, which was at least partially blocked, is no longer blocked; and
   causing the one or more MFCs to adjust the flow velocities in the one or more DGL nozzle control regions such that the flow velocity in the DGL nozzle control region, which includes the DGL nozzle that is no longer blocked, is at a particular level.

11. The method of claim 8, wherein causing the flow velocity in the DGL nozzle control region, which includes the DGL nozzle that is at least partially blocked, to be decreased comprises causing the one or more MFCs to adjust the flow velocities in the one or more DGL nozzle control regions.

12. The method of claim 11, wherein causing the flow velocity in the DGL nozzle control region, which includes the DGL nozzle that is at least partially blocked, to be decreased after causing the one or more MFCs to increase the flow velocity in the DGL nozzle control region that includes the DGL nozzle that is at least partially blocked.

13. A radiation source, comprising:
   a plurality of pressure sensors, wherein each pressure sensor of the plurality of pressure sensors is positioned at a respective dynamic gas lock (DGL) nozzle of a plurality of DGL nozzles of an intermediate focus (IF) cap,
   wherein each pressure sensor of the plurality of pressure sensors is to provide a signal indicating a respective pressure at a corresponding DGL nozzle of the plurality of DGL nozzles;
   a plurality of mass flow controllers (MFCs), wherein each MFC of the plurality of MFCs is to control a flow velocity in a respective DGL nozzle control region of a plurality of DGL nozzle control regions,
      wherein each DGL nozzle control region is associated with a respective subset of DGL nozzles from the plurality of DGL nozzles; and
   a plurality of manifolds, wherein each manifold of the plurality of manifolds is to provide a fluid to a respective DGL nozzle control region of the plurality of DGL nozzle control regions.

14. The radiation source of claim 13, further comprising a controller configured to control the plurality of MFCs in association with adjusting flow velocities in the plurality of DGL nozzle control regions based on pressures detected by the plurality of pressure sensors.

15. The radiation source of claim 13, wherein the plurality of DGL nozzles, at which the plurality of pressure sensors are positioned, are located in a first row of DGL nozzles of the IF cap.

16. The radiation source of claim 13, wherein a respective pressure sensor of the plurality of pressure sensors is positioned at every DGL nozzle in a particular row of DGL nozzles of the IF cap.

17. The radiation source of claim 13, wherein each subset of DGL nozzles includes at least four DGL nozzles in a first row of DGL nozzles of the IF cap.

18. The radiation source of claim 13, wherein the plurality of DGL nozzle control regions includes two or more DGL nozzle control regions.

19. The radiation source of claim 13, wherein the plurality of manifolds includes two or more manifolds.

20. The radiation source of claim 13, wherein distances of fluid paths through each of the plurality of manifolds are substantially the same among the plurality of manifolds.

* * * * *